US010878732B2

(12) United States Patent
Schubert et al.

(10) Patent No.: US 10,878,732 B2
(45) Date of Patent: *Dec. 29, 2020

(54) DIRECTIONAL LIGHT EMITTERS AND ELECTRONIC DISPLAYS FEATURING THE SAME

(71) Applicant: X Development LLC, Mountain View, CA (US)

(72) Inventors: Martin Friedrich Schubert, Mountain View, CA (US); Michael Jason Grundmann, San Jose, CA (US); Raj B. Apte, Palo Alto, CA (US); Benoit Schillings, Los Altos Hills, CA (US)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/544,432

(22) Filed: Aug. 19, 2019

(65) Prior Publication Data

US 2019/0378445 A1 Dec. 12, 2019

Related U.S. Application Data

(63) Continuation of application No. 15/850,743, filed on Dec. 21, 2017, now Pat. No. 10,424,232.

(51) Int. Cl.
*G09G 3/00* (2006.01)
*H01L 27/15* (2006.01)
(Continued)

(52) U.S. Cl.
CPC .......... *G09G 3/001* (2013.01); *G02B 26/08* (2013.01); *G09G 3/32* (2013.01); *H01L 27/153* (2013.01);
(Continued)

(58) Field of Classification Search
CPC .. G09G 3/001; G09G 3/32; G09G 2300/0439; G09G 2300/0443;
(Continued)

(56) References Cited

U.S. PATENT DOCUMENTS 5,936,596 A * 8/1999 Yoshida ................ G02F 1/1323
345/87
RE39,539 E 4/2007 Torch
(Continued)

FOREIGN PATENT DOCUMENTS

KR 101295217 8/2013

OTHER PUBLICATIONS

Wikipedia [online] "HDMI" Publicly available on or before Mar. 19, 2004 [Retrieved from the Internet Sep. 21, 2017], <https://en.wikipedia.org/wiki/HDMI>, 25 pages.
(Continued)

*Primary Examiner* — Tom V Sheng
(74) *Attorney, Agent, or Firm* — Fish & Richardson P.C.

(57) ABSTRACT

Methods, systems, and apparatus, including computer programs encoded on computer storage media, for changing a distributed mode loudspeaker's fundamental frequency. One of the systems may include a light emitting diode display that includes an array of pixels, each pixel including, for each color of multiple colors, a directional light emitter and a wide-angle light emitter, a first combination of all the directional light emitters configured to generate a first display image viewable within a first viewing angle, and a second combination of all the wide-angle light emitters configured to generate a second display image concurrently with the generation of the first display image that is viewable within a second viewing angle. The first display image is a different image than the second display image and the first
(Continued)

viewing angle is a narrower viewing angle than, and included within, the second viewing angle.

20 Claims, 13 Drawing Sheets

(51) Int. Cl.
G02B 26/08 (2006.01)
G09G 3/32 (2016.01)
H04N 13/376 (2018.01)
H04N 13/32 (2018.01)
H04N 13/351 (2018.01)
H04N 13/383 (2018.01)

(52) U.S. Cl.
CPC ........... *H04N 13/32* (2018.05); *H04N 13/376* (2018.05); *G09G 2300/0443* (2013.01); *G09G 2300/0452* (2013.01); *G09G 2320/028* (2013.01); *G09G 2320/068* (2013.01); *G09G 2354/00* (2013.01); *G09G 2358/00* (2013.01); *H04N 13/351* (2018.05); *H04N 13/383* (2018.05)

(58) Field of Classification Search
CPC ..... G09G 2300/0452; G09G 2300/046; G09G 2320/028; G09G 2320/068; G09G 2354/00; G09G 2358/00; G02B 26/08; H01L 27/153; H04N 13/383; H04N 13/351
See application file for complete search history.

(56) References Cited

U.S. PATENT DOCUMENTS

| | | |
|---|---|---|
| 8,525,754 B2 | 9/2013 | Sumiyoshi |
| 10,424,232 B2 * | 9/2019 | Schubert ................ H04N 13/32 |
| 2005/0111100 A1 | 5/2005 | Mather et al. |
| 2006/0139234 A1 | 6/2006 | Tanaka |
| 2007/0091037 A1 * | 4/2007 | Lee ..................... G02B 26/0875 345/84 |
| 2007/0252801 A1 * | 11/2007 | Park ..................... G09G 3/3607 345/88 |
| 2009/0040426 A1 | 2/2009 | Mather et al. |
| 2009/0102990 A1 | 4/2009 | Walton et al. |
| 2010/0118045 A1 | 5/2010 | Brown et al. |
| 2012/0133683 A1 | 5/2012 | Goden et al. |
| 2012/0200802 A1 | 8/2012 | Large |
| 2013/0100112 A1 | 4/2013 | Yeh et al. |
| 2013/0258451 A1 * | 10/2013 | El-Ghoroury .......... H04N 13/32 359/298 |
| 2014/0375542 A1 | 12/2014 | Robbins et al. |
| 2016/0210473 A1 * | 7/2016 | Cohen ................ G06K 9/00255 |
| 2016/0358014 A1 | 12/2016 | Cohen et al. |
| 2017/0154563 A1 * | 6/2017 | Lin ....................... G06F 1/3218 |
| 2017/0255041 A1 * | 9/2017 | Chang ............... G02F 1/134336 |
| 2018/0122292 A1 * | 5/2018 | Ju ......................... G02B 3/005 |
| 2018/0190729 A1 * | 7/2018 | Chu-Ke .............. H01L 27/3213 |
| 2019/0197928 A1 | 6/2019 | Schubert |

OTHER PUBLICATIONS

PCT International Search Report and Written Opinion in International Appln. No. PCT/US2018/065510, dated Apr. 25, 2019, 11 pages.

PCT International Preliminary Report on Patentability in International Appln. No. PCT/US2018/065510, dated Jun. 23, 2020, 8 pages.

* cited by examiner

DIRECTIONAL LIGHT EMITTERS AND ELECTRONIC DISPLAYS FEATURING THE SAME

CROSS-REFERENCE TO RELATED APPLICATIONS

The present application is a continuation of U.S. patent application Ser. No. 15/850,743, filed Dec. 21, 2017, now allowed. The contents of the prior application are incorporated herein by reference in their entirety.

TECHNICAL FIELD

This disclosure relates to directional light emitters and displays featuring directional light emitters, including light field displays and dual mode displays.

BACKGROUND

Many direct view flat panel displays generate images by selectively modulating a light intensity emitted by each pixel in an array across the panel. In full color displays, each pixel is composed of differently colored subpixels (e.g., red, green, blue or cyan, yellow, magenta), the display emitting varying amounts of colored light from each subpixel that additively combine so that each pixel, as a whole, appears a desired color that is a combination of the subpixel light.

Some displays use light emitting diodes (LEDs), including inorganic or organic LEDs, to generate an image. For instance, each subpixel can include a red, green, or blue LED to provide full color images. Typically, each LED emits light substantially isotropically into a hemisphere so that multiple viewers can view the same displayed image from various locations about the display. For example, the LEDs can be Lambertian emitters, where the relative intensity of light falls off as the square of the cosine of the viewing angle as one moves off the axis normal to the display. Indeed, a wide viewing angle (e.g., as much as 170° in the horizontal viewing plane) is a desirable feature in many applications, such as displays used as large, wall-mounted televisions.

SUMMARY

Displays composed of arrays of small, directional light emitters are disclosed. Each pixel (or subpixel, e.g., for color displays with spatially synthesized color) is composed of multiple emitters, each arranged to direct light into different viewing directions. Such displays can present different images when viewed from different directions.

For example, pixels composed of multiple directional emitters each arranged to direct light into different viewing directions can be used to form light field displays, in which each pixel (or each subpixel) selectively directs light into one or more discrete directions within an overall viewing cone of the display (e.g., 170° or more in both the horizontal and vertical directions). When viewed from different directions, light field displays can display different images. For example, light field displays can display images of the same object or scene but from different viewpoints depending on the location of the viewer. In some embodiments, light field displays can provide stereoscopic 3D imagery, where different images of the same object or scene are presented to each of the viewer's eyes.

In some implementations, multiplexing techniques are used to increase the resolution of a light field pixel. For example, pixels can be manipulated to direct light from a light emitter into different directions at different moments during a single image frame. For example, pixels can include one or more actuable optical elements that can be manipulated to direct light into different directions. MEMS mirrors and/or variable lenses can be used for this purpose.

In some embodiments, the directional emitters are composed of resonant cavity emitters in which a small light source, such as a micro-light emitting diode (µLED) is incorporated within an optical cavity that enhances emission into a narrow range of angles. Alternatively, or additionally, photonic crystal layers can also be used to inhibit propagation of certain modes from an emitter, providing directional emission.

Light field display pixels utilizing coherent light sources are also contemplated. For example, a light field pixel can introduce a variable phase shift across a coherent wavefront, selectively generating bright and dark diffractive maxima at different angular viewing positions.

In some embodiments, display pixels can include a combination of directional and isotropic emitters. For example, each pixel can include one or more directional µLEDs along with an isotropic-emission µLED. Such a display's pixel array can include directional light emitters that generate a first image with a first, narrow, viewing angle, e.g., viewable by a single viewer. Each pixel also includes a wide-angle light emitter that generates a second image with a second, wider, viewing angle, e.g., viewable by multiple viewers. The first image may be viewable concurrently with the second image by only the single viewer, e.g., while the other viewers from the multiple viewers view the second image but cannot view the first image. This may enhance security, privacy, or both, for content included in the first image.

The directional light emitters can be co-located on the display with corresponding wide-angle light emitters (e.g., a pixel region on the display may include both a directional light emitter and a wide-angle light emitter for a particular color used to generate a respective pixel). Alternatively, a group of directional light emitters (e.g., all colors for a respective pixel) can be located near a corresponding group of wide-angle light emitters. The light emitters are sufficiently close together so that a viewer of the display perceives light emitted from the group of directional light emitters to come from the same location on the display as the corresponding group of wide-angle light emitters.

In general, systems that include displays with directional emitters may adjust an angle at which the display projects light from the directional light emitters. For instance, the system can use eye-tracking to determine a predicted angle at which a viewer is looking at the display. The system may use the predicted angle to determine an adjustment to some or all of the directional light emitters in the display, e.g., a set of directional light emitters, and cause the display to adjust the angle at which light from the directional light emitters is projected, e.g., using beam steering. In some examples, the system causes adjustment of the directional light emitters while maintaining the direction at which the wide-angle light emitters project light, e.g., the wide-angle light emitters can be fixed.

A system may dynamically adjust content presented by the light emitters. For instance, the system may detect input indicating that the display should present a third image, using a second array of directional light emitters that are separate light emitters from a first array of directional light emitters, e.g., described above. In response, the display may use the second array of directional light emitters to generate the third image, e.g., which may be viewable by another viewer. The input detected by the system can include identifying entry of the person in a room that includes the display, input received from a control device, or another appropriate form of input. The presentation of two or more images concurrently by the display may reduce the hardware footprint necessary to concurrently present the images, may reduce the power necessary to generate the images, or both.

In some implementations, the system can dynamically adjust content presented by the light emitters based on a determination of which content should be presented by wide-angle light emitters. For instance, the system may initially present first content in one or more first images generated by the directional light emitters and second content in one or more second images generated by the wide-angle light emitters. The system may determine that the wide-angle light emitters should present the first content and the directional light emitters should present the second content, e.g., in response to receipt of user input or determining a context change. The context change may be entry of another person into a room that includes the display and a determination to present the first content to the other person in addition to a person who was first viewing the first content while presenting the second content to the original viewer of that content.

In general, in a first aspect, the invention features a light emitting device that includes a substrate supporting a first light emitting element and a second light emitting element, the first light emitting element being configured to emit, in a first principal direction, light in a first wavelength band and the second light emitting element being configured to emit, in the first principal direction, light in a second wavelength band different from the first wavelength band, each light emitting element including: a light emitting diode layer, extending in a plane perpendicular to the first direction, having a thickness of 10 microns or less in the first direction and a maximum lateral dimension of 100 microns or less orthogonal to the first direction, the light emitting diode layer including a semiconductor material; and one or more layers configured to enhance an optical mode (or one or more optical modes) of the light emitted in the corresponding first or second wavelength band perpendicular to the plane and/or suppress an optical mode (or one or more optical modes) of the light emitted in the corresponding first or second wavelength band in the plane.

Embodiments of the system can include one or more of the following features.

The light emitting diode layer of each light emitting element can include an active layer, a hole transport layer, and an electron transport layer.

The one or more layers configured to enhance/suppress optical mode(s) can include, for at least one of the light emitting elements, at least two layers positioned on opposite sides of the diode layer, and the at least two layers can form a resonant optical cavity configured to enhance the optical mode(s) of the light emitted in the corresponding one of the first or second wavelength bands perpendicular to the plane. For at least one of the light emitting elements, the two layers can be reflective at the corresponding one of the first and second emitted wavelengths. At least one of the reflective layers can include a Distributed Bragg Reflector and/or can provide an electrically-conductive contact. One of the two layers can be partially transmissive at the corresponding one of the first and second emitted wavelengths.

The one or more layers configured to enhance/suppress optical mode(s) can include, for at least one of the light emitting elements, a photonic crystal layer positioned adjacent to the diode layer, the photonic crystal layer including a two dimensional photonic crystal structure that is configured to suppress the optical mode(s) of the light emitted in the corresponding one of the first and second wavelength bands in the plane.

For at least one of the light emitting elements, the light emitting diode layer can have a thickness of 10 μm or less, 5 μm or less, or 3 μm or less in the first direction and/or a maximum lateral dimension of 50 μm or less, 20 μm or less, 10 μm or less, orthogonal to the first direction.

For at least one of the light emitting elements, the light emitting diode layer can include an inorganic crystalline semiconductor material, such as a III-V semiconductor material or a II-CI semiconductor material. The light emitting diode layer can additionally or alternatively include an organic semiconductor material, such as poly(p-phenylene vinylene).

The first and/or second wavelength band of the corresponding light emitting element can include visible light (e.g., 390 to 700 nm).

The first and/or second light emitting element can be configured to emit light in a corresponding first principal direction with a divergence angle 15° or less, 10° or less, 8° or less, 5° or less, 3° or less, 2° or less, or 1° or less.

In general, in a further aspect, the invention features a light emitting device, including a plurality of light emitting elements each configured to emit light in a first wavelength band in a first direction, each light emitting element including a light emitting diode layer extending in a plane perpendicular to the first direction and configured to produce light of the first wavelength, each light emitting element further including one or more layers configured to enhance an optical mode (or one or more modes) of the light emitted in the first wavelength perpendicular to the plane or suppress an optical mode (or one or more modes) of the light emitted in the first wavelength in the plane; and one or more light directing elements positioned to receive the light emitted by the plurality of light emitting elements and direct the light from each of the light emitting elements into a corresponding one of a plurality of different principal directions.

Embodiments of the system can include one or more of the following features.

The plurality of light emitting elements can be arranged as an array (e.g., one dimensional array, two dimensional array).

Each light directing element (including e.g., a refractive, diffractive, or reflective element) can be positioned to receive the light emitted by a corresponding light emitting element of the plurality of light emitting elements and direct the received light into a corresponding one of a plurality of different principal directions. Alternatively, or additionally, each light directing element can be positioned to receive the light emitted by more than one of the plurality of light emitting elements and direct the received light from each of the more than one light emitting elements into a corresponding one of a plurality of different principal directions.

The one or more of the light directing elements can be a diffractive optical element arranged to diffract incident light from each of the light emitting elements into the corresponding one of the different principal directions. The one or more of the light directing elements can be a mirror arranged to reflect incident light from each of the light emitting elements into the corresponding one of the different directions. The mirror can be actuable. The one or more of the light directing elements can be a lens arranged to refract incident light from each of the light emitting elements into the corresponding ones of the different principal directions. The lens can be deformable.

The light emitting device can further include an actuator arranged to vary a relative position between the plurality of light emitting elements and the light directing element. The light directing element can direct light received from a light emitting element into different principal directions depending on the relative position between the light directing element and the light emitting element.

The light emitting device can further include a second plurality of light emitting elements configured to emit light in a second wavelength band different from the first wavelength band in the first direction.

The one or more layers of the light emitting device can include two layers positioned on opposite sides of the diode layer, the two layers forming a resonant optical cavity configured to enhance the optical mode(s) of the light emitted in the first wavelength perpendicular to the plane. Additionally, or alternatively, the one or more layers can include a photonic crystal layer positioned adjacent to the diode layer, the photonic crystal layer including a two dimensional photonic crystal structure configured to suppress the optical mode(s) of the light emitted in the first wavelength in the plane. Additionally, or alternatively, the one or more layers can be configured to enhance the optical mode(s) of the light emitted in the first wavelength perpendicular to the plane and suppress the optical mode(s) of the light emitted in the first wavelength in the plane.

The diode layer can include an active layer, a hole transport layer, and an electron transport layer.

The light emitting device can be incorporated into a light field display.

A light field display can include a plurality of the light emitting devices, the light emitting devices being arrayed in a plane as a plurality of pixels each emitting a light field of a first color. The light field display can further include a second plurality of light emitting devices configured to emit light at a second wavelength and a third plurality of light emitting devices configured to emit light at a third wavelength, the first, second, and third wavelengths being different, in which the light emitting devices are arranged to form an array of pixels, each pixel including three subpixels each having a light emitting device that emits light at the first, second, or third wavelengths, respectively.

In general, in a further aspect, the invention features a light field display for displaying a series of image frames to one or more viewers, the light field display including a plurality of light field pixels, each light field pixel including a plurality of light emitting elements, each light emitting element being configured to emit substantially collimated light, in which each light field pixel selectively emits light from each light emitting element into one or more of a plurality of different viewing directions during a single image frame during operation of the light field display; and an electronic controller in communication with the plurality of pixels, the electronic controller being programmed to cause each light field pixel to direct light into one or more of the plurality of different viewing directions such that a perspective of a displayed image varies according to the viewing direction.

Embodiments of the system can include one or more of the following features.

The substantially collimated light can form a light beam with a divergence angle 15° or less, 10° or less, 8° or less, 5° or less, 3° or less, 2° or less, or 1° or less.

Each of the light emitting element can include a light emitting diode arranged in a resonant cavity. Each light emitting diode can have a thickness of 10 microns or less in the first direction and a maximum lateral dimension of 100 microns or less.

Each of the light emitting elements can include a light emitting diode coupled to a two dimensional photonic crystal.

Each light field pixel can further include one or more light directing elements (including, e.g., a refractive optical element, a diffractive optical element, or a reflective optical element). The one or more light directing element can each be switchable between two or more configurations in which the light directing element directs light from a light emitting element into a different viewing direction. Each of the one or more light directing elements can have a variable optical power and can be switchable between different optical states by varying the optical power. For example, each of the one or more light directing elements can include a deformable lens or an actuable mirror.

The one or more light directing element can each be switchable between the two or more configurations during a single frame of the light field display.

For each light field pixel, light from a single light emitting element can be sequentially directed into multiple viewing directions during a single frame. Additionally, or alternatively, light from a single light emitting element can be directed to a single corresponding viewing direction during each frame.

Each light field pixel can include three light field sub-pixels each configured to emit light of a different color (e.g., red, green, or blue light, or either cyan, magenta, or yellow light).

The light field display can have four or more, or 10 or more, viewing directions in at least one viewing plane.

The electronic controller can be programmed to control the pixels to display a different perspective of a common scene in each of the different viewing directions. The different perspectives can be perceivable as a stereoscopic image of the common scene by a viewer.

In general, in a further aspect, the invention features a light field display for displaying a series of image frames to one or more viewers, the light field display including: one or more coherent light sources; a plurality of light field pixels, each light field pixel arranged to receive light from one of the coherent light sources, each light field pixel including a plurality of phase-shifting elements, each phase shifting element being arranged in a path of a portion of the received light and configured to variably shift a phase of the received light relative to the other phase-shifting elements of the light field pixel to produce phase-shifted light, the light field pixel being configured to emit the phase-shifted light from the phase shifting elements collectively as emitted light so that, during operation of the light field display, the light field pixel selectively directs light into one or more of a plurality of different viewing directions during a single image frame; and an electronic controller in communication with the plurality of light field pixels, the electronic controller being programmed to cause each light field pixel to direct light into one or more of the plurality of different viewing directions such that a perspective of a displayed image varies according to the viewing direction.

Embodiments of the system can include one or more of the following features.

The coherent light sources can be laser light sources (e.g., semiconductor laser light sources).

The coherent light sources can include at least one source of red light, at least one source of green light, and at least one source of blue light. The coherent light sources can include at least one source of cyan light, at least one source of magenta light, and at least one source of yellow light.

The light field display can include a waveguide coupling the at least one coherent light source to the light field pixel. For example, the waveguide can be a fiber waveguide.

The multiple light field pixels can be coupled to a single one of the coherent light sources.

Each light field pixel can include a plurality of sub-pixels, each sub-pixel arranged to receive light from a differently colored one of the one or more coherent light sources.

Each phase-shifting element can include an electrooptic material.

Each light field pixel can include a plurality of outcoupling elements each coupled to a corresponding phase-shifting element, the outcoupling element being configured to receive phase-shifted light from the corresponding phase-shifting element and emit the phase-shifted light from the light field pixel. Each outcoupling element can include a grating, a lens, or a mirror. Each outcoupling element can be configured to direct light from the corresponding phase-shifting element in a common direction.

Each light field pixel can include a spatial phase modulator including an array of the phase-shifting elements.

The light field pixel can further include one or more optical elements arranged to expand and collimate light from the at least one coherent light source to illuminate the spatial phase modulator.

In general, one innovative aspect of the subject matter described in this specification can be embodied in a system that includes an array of pixels, each pixel including, for each color of multiple colors, a directional light emitter and a wide-angle light emitter, a first combination of all the directional light emitters configured to generate a first display image viewable within a first viewing angle, and a second combination of all the wide-angle light emitters configured to generate a second display image concurrently with the generation of the first display image that is viewable within a second viewing angle, in which the first display image is a different image than the second display image and the first viewing angle is a narrower viewing angle than, and included within, the second viewing angle. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in methods that include the actions of generating, by a light emitting diode display using a plurality of wide-angle emitters, a first display image viewable in a first viewing angle; and generating, by the display using a plurality of directional emitters concurrently with generation of the first display image, a second display image that is a different image than the first display image and is viewable in a second viewing angle that is a smaller viewing angle than, and included within, the first viewing angle. Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The array of pixels may include groups of color specific sub-pixels, each of the color specific sub-pixels including a directional light emitter and a wide-angle light emitter. The array of pixels may include groups of viewing angle specific sub-pixels, each of the viewing angle specific sub-pixels including, for each color in a group of colors, a light emitter specific to the corresponding viewing angle and for the respective color. The group of colors may consist substantially of red, green, and blue. The group of colors may consist substantially of cyan, magenta, yellow, and black. Each of the directional light emitters may be adjacent to another directional light emitter of a different color. The system may include a directional pixel-subset that includes, for each color in a group of colors, a respective directional light emitter; and a wide-angle pixel-subset that includes, for each color in the group of colors, a respective wide-angle light emitter, each directional pixel-subset included in the light emitting diode display adjacent to a corresponding wide-angle pixel-subset that has the same position in the array of pixels as the directional pixel-subset. Each of the directional light emitters may be adjacent to a wide-angle light emitter of the same color.

In some implementations, the system may include an electronic controller to change a viewing angle for the directional light emitters. The electronic controller may include an array of light directing elements. The electronic controller may include one light directing element for each of the directional light emitters. The electronic controller may include one light directing element for each group of the directional light emitters. The system may include a communication module to receive viewing angle adjustment data and provide the viewing angle adjustment data to the electronic controller. The system may include an eye-tracking component to determine eye movement data for a viewer, generate viewing angle adjustment data, and provide the viewing angle adjustment data to the electronic controller to change the viewing angle of the directional light emitters.

In some implementations, generating, by the display using the plurality of directional emitters concurrently with generation of the first display image, the second display image may include generating, by the display using the plurality of directional emitters after generation of the first display image, the second display image for presentation concurrently with presentation of the first display image. A method may include changing, by the display using an electronic controller, the second viewing angle of the second display image. Changing the second viewing angle of the second display image may include adjusting, by the electronic controller, one or more light directing elements to change the second viewing angle of the second display image. A method may include receiving viewing angle adjustment data; and generating, by the electronic controller, angle adjustment commands using the viewing angle adjustment data. Changing, by the electronic controller, the second viewing angle of the second display image may include adjusting, by the electronic controller, one or more light directing elements using the angle adjustment commands. Receiving the viewing angle adjustment data may include capturing, by a camera, one or more images; and determining, by an eye-tracking module, the viewing angle adjustment data using the one or more images.

Among other advantages, the disclosed technologies can maintain display resolution while projecting different light fields simultaneously into various viewing directions. The disclosed technology can enable light field displays that do not require wearable devices such as glasses or headsets for use. Disclosed display technologies can use temporal and spatial multiplexing for cheaper fabrication and more efficient use of light emitting elements.

In some embodiments, the systems and methods described below may overlay content viewable within a narrow viewing angle on top of content viewable within a wide viewing angle to supplement the wide viewing angle content, e.g., with menus or other content that some viewers do not need to see. For instance, the systems and methods described below may enhance presentation of content, e.g., a three-dimensional model, in a wide viewing angle by presenting less relevant content, e.g., a menu, in a narrow viewing angle. In some implementations, the systems and methods described below may present sensitive content in a narrow viewing angle to increase security, privacy, or both, of the sensitive content while presenting non-sensitive content in a wide viewing angle, e.g., when the non-sensitive and sensitive content are related. In some implementations, the systems and methods described below may use eye-tracking for a particular viewer to adjust the narrow viewing angle to follow movement of the particular viewer and reduce a likelihood that other viewers can view the narrow viewing angle content.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
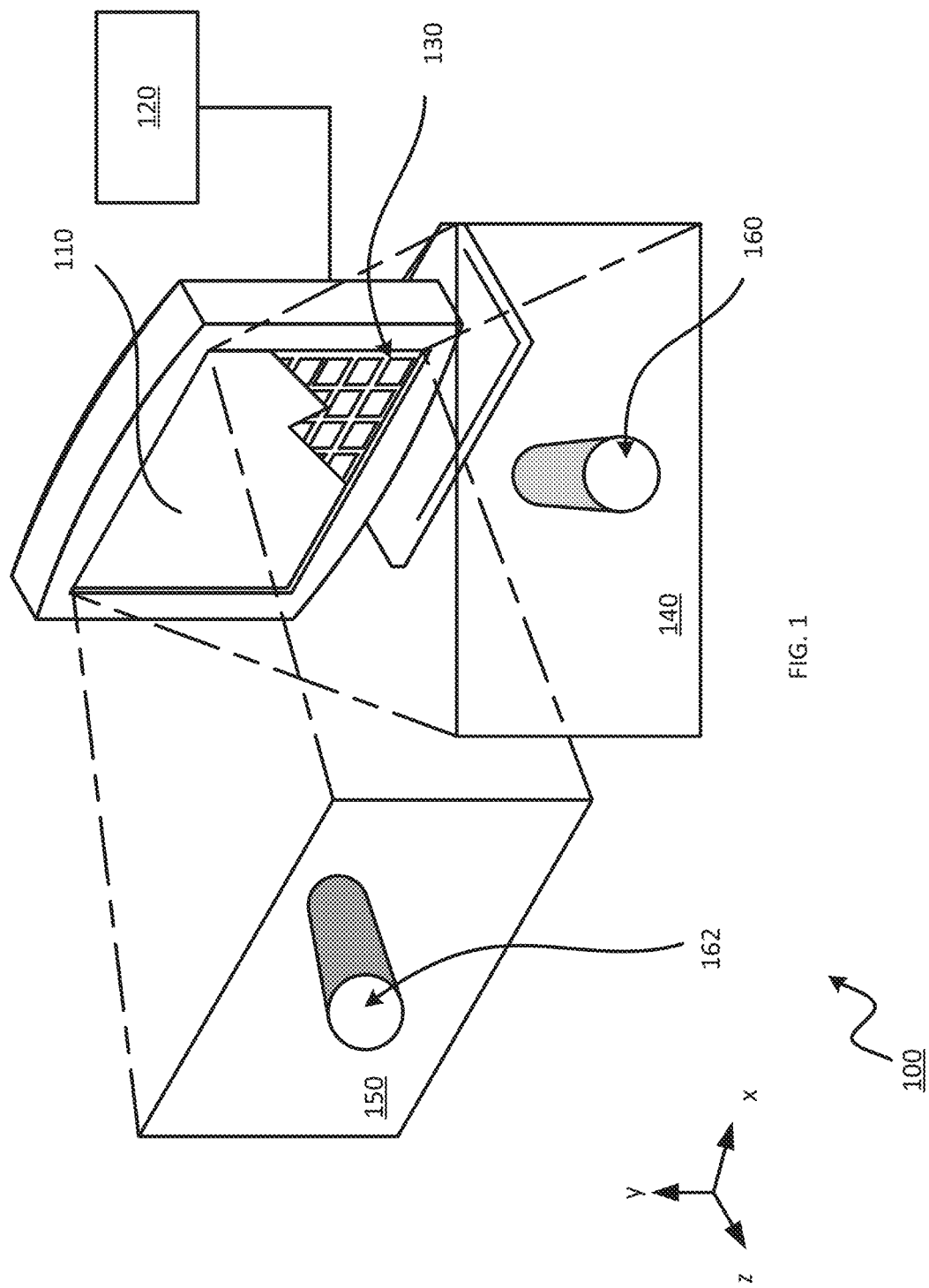
FIG. 1 is a schematic diagram of a light field display.

FIG. 1 is a schematic diagram of a light field display system 100. The system includes a light field display 110 and a controller 120. Display 110 includes an array of light field pixels 130, each configured to emit light selectively into discrete angular directions within a viewing volume of the display. Accordingly, light field display 110 displays different images to different viewing locations, as illustrated by a first light field image 160 visible to a viewer located to a first viewing location 140, and a second, different light field image 162 simultaneously visible to a viewer at a second, different viewing location 150. A Cartesian coordinate system is shown for ease of reference. In this reference frame, the z-axis is normal to the plane of display 110. The x-axis corresponds to the horizontal viewing direction and the y-axis to the vertical viewing direction.

Light field images are dynamically adjusted by controller 120, which provides coordinated control signals to each pixel 130, modulating each pixel's corresponding light field.

During operation, controller 120 updates the light field images in each direction at a certain frequency (e.g., frame rate) that allows the eye to perceive a continuous image. In general, the frame rate can vary. In some embodiments, display 110 can deliver video light fields e.g., at frames rates of 30 Hz or more, 60 Hz or more, 120 Hz or more.

In general, display 110 can simultaneously project different images of a single object or a sequence of images of the same scene (e.g., a movie) in multiple viewing directions. In some embodiments, e.g., where the light field display has sufficient angular resolution, display 110 can provide stereoscopic imagery to one or more viewers, providing a 3D viewing experience. As illustrated, light field images 160 and 162 are images of two different perspectives of a single object presented into viewing locations 140 and 150 respectively. If these images of different perspectives of a single object are displayed stereoscopically to the eyes of a single observer, that observer perceives a 3D image of that object. If a sequence of such images is displayed stereoscopically to the eyes of a single observer, a 3D movie is perceived.

Alternatively, or additionally, light field display 110 can be used to simultaneously present different images or different movies to viewers located in different viewing locations. For example, two viewers can watch two different 2D movies on the same light field display or can watch the same 3D movie but from two different perspectives.

In general, the size and resolution of display 110 can vary. Typically, display 110 has a diagonal dimension in a range from about 25 inches to about 150 inches, although the disclosed technology can be applied to smaller and larger displays. Resolution can be UXGA, QXGA, 480p, 1080p, 4K UHD or higher, for example. Moreover, while display 110 is depicted as having a base mount, more generally the technology disclosed can be implemented in other display form factors, such as, for example, wall mounted displays, billboard displays, mobile devices (e.g., handheld devices, such as smartphones and tablet computers), wearable computers (e.g., smartwatches), etc.

Figure 2A:
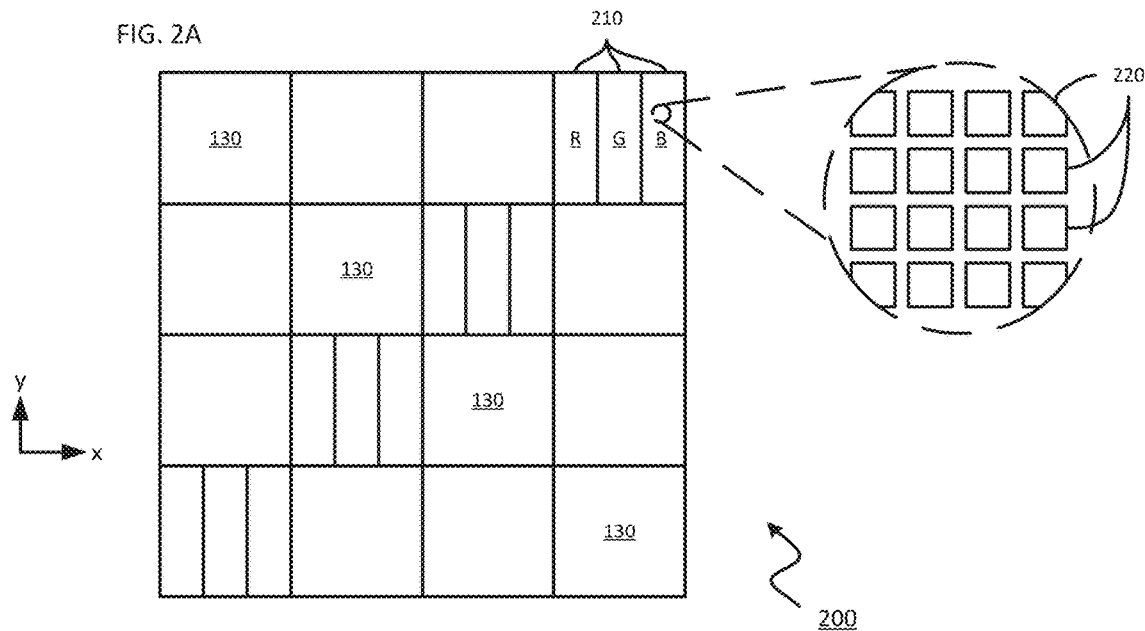
FIG. 2A is a plan view of an array of light field pixels from the light field display shown in FIG. 1.
Figure 2B:
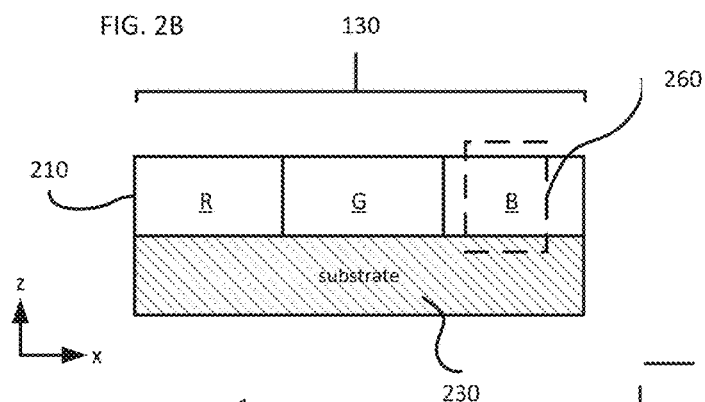
FIG. 2B is a cross-sectional view of a light field pixel from the light field display shown in FIG. 1.

Referring to FIGS. 2A and 2B, light field pixels 130 are arranged in an array 200. Light field pixels 130 are each composed of three subpixels 210 for three colors of the display: red ("R"), green ("G"), and blue ("B"). Full color images are spatially synthesized by proportionate color mixing of these three colors at different subpixel intensity outputs in a particular direction. As shown in the cross-sectional view 250 of pixel 130 in FIG. 2B, the three subpixels 210 are supported by a substrate 230 (e.g., a semiconductor substrate).

Figure 2C:
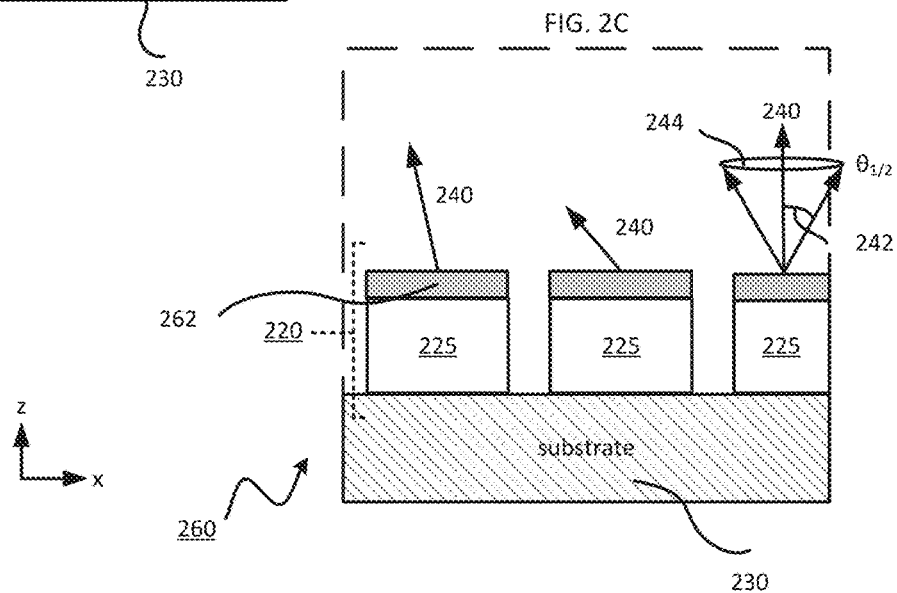
FIG. 2C is a cross-sectional view of a subpixel showing multiple directional light emitters, including micro light emitting diodes (μLEDs).

Each subpixel 210 is, in turn, composed of an array of directional light emitters 220, as shown in the inset in FIG. 2C. Directional light emitters 220 emit light at wavelengths corresponding to the subpixel colors R, G, or B in predominantly one direction.

By way of example, FIG. 2C is a schematic cross-section 260 of a blue subpixel. Each directional emitter 220 includes a micro-light emitting diode (μLED) 225 and a light directing element 262.

In combination, μLED 225 and light directing element 262, produce directional light propagating predominantly along a single direction. In other words, the emitted light has a principal direction 240 and is substantially collimated. For example, each μLED 225 can be similarly configured to emit substantially collimated light that is perpendicular to the x-y plane of the corresponding light directing element. Each light directing element 262 steers the light into a specific direction 240 (e.g., the viewing direction). By using a different light directing element for each μLED, each μLED in a subpixel directs light in unique direction.

In general, the degree of collimation of light emitted from directional light emitter 220 can vary depending on the specific structure of the μLED and the light directing element. The degree of collimation can be characterized by a divergence angle 242 at which intensity drops off to half of the intensity along the principle direction 240 (e.g., $\theta_{1/2}$ angle). As used herein, substantially collimated light is considered to be weakly diverging light, having a divergence angle 242 of 15° or less (e.g., 10° or less, 8° or less, 5° or less, 3° or less, 2° or less, 1° or less). Substantially collimated light can include more highly collimated light, such as light having a divergence angle 242 of 10° or less, 8° or less, 5° or less, 3° or less, 2° or less, 1° or less. This divergence angle 242 corresponds to the solid angle of light 244 emitted from directional light emitter 220.

Light directing elements 262 for individual μLEDs 225 can be refractive (e.g., lenses, prisms) or diffractive (e.g., gratings, diffractive lenses, diffractive optical elements). Elements 262 can be deposited on μLED structures 225 using various microfabrication methods. For example, the elements can be deposited using sputtering, atomic layer deposition, or chemical vapor deposition. Photolithography techniques such as masking and lift off can be used to selectively deposit different directing elements 262 (e.g., directing light in different directions) on different μLED structures 225.

Although FIG. 2A shows a dense, square array 200 of pixels 130, other array geometries and densities are contemplated. Arrays can be 2D, as shown in FIG. 2A, or 1D, e.g., a line of pixels 130. Additionally, or alternatively, arrays can be sparse, with empty space between pixels 130.

Although FIG. 2B shows adjacent color subpixels 210, other subpixel arrangements are contemplated. For example, subpixels 210 of different colors can be interleaved within pixel 130.

As noted above, light field display 110 has a resolution corresponding to the number of pixels in the display. This corresponds to the resolution of images produced by the display. In addition, light field display has an angular display resolution, which is determined by the number of μLEDs 225 in each subpixel, and corresponds to the number of discrete viewing directions available to the display 110. In general, the angular resolution of display 110 therefore depends on both the number of individual light emitters in each subpixel and the divergence angle of each emitter.

μLEDs are particularly suited to use in light field displays 110 because they can be made extremely small while still efficiently producing sufficient light for purposes of a display.

Figure 3A:
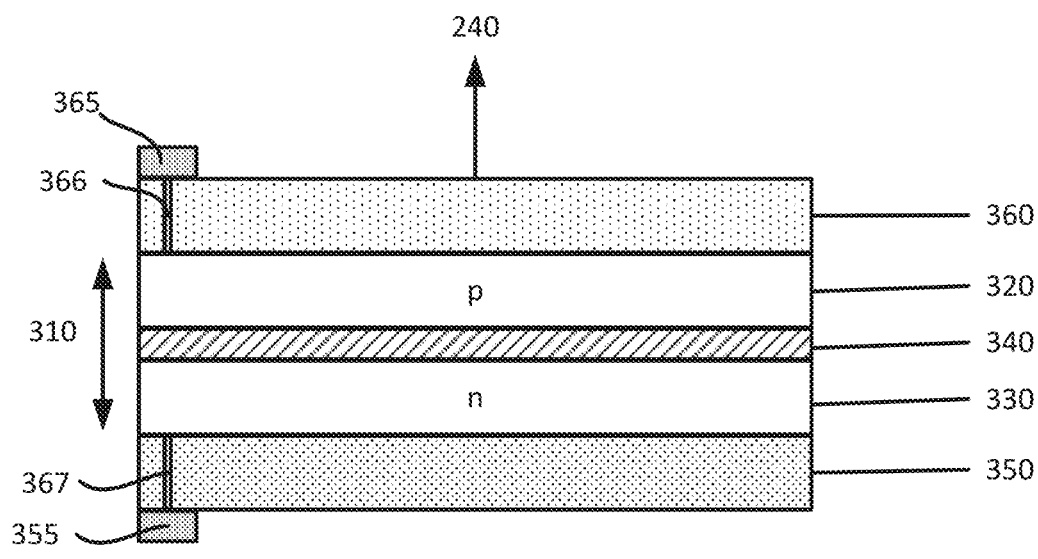
FIG. 3A is a schematic cross-section of an embodiment of a micro-scale resonant cavity LED.
Figure 3A:
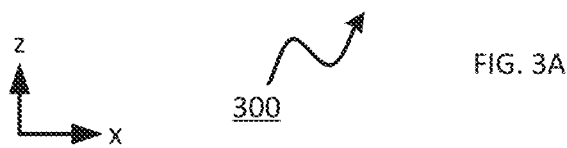

FIG. 3A shows an example μLED 225 that produces substantially collimated light: a micro-scale resonant cavity light emitting diode 300 (μRCLED). μRCLED 300 includes a diode layer 310 (e.g., light emitting diode, or LED) within an optical cavity defined by two reflector layers, 350 and 360. μRCLED 300 emits light with a principal direction 240 perpendicular to diode layer 310.

As illustrated, diode layer 310 includes a hole transport layer 320, an electron transport layer 330, and an active layer (or emission layer or active region layer) 340. More generally, more complex diode structures can be used, such as quantum heterostructures. The electron and hole transport layers are also known in the art as cladding or confinement layers. The electron transport layer is in electrical contact with bottom contact electrode 355 through a via 366, and the hole transport layer is in electrical contact with top contact electrode 365 through a via 367. Although FIG. 3A shows the hole transport layer above the electron transport layer, the relative position of the electron and hole transport layers can be reversed without loss of function.

When a positive voltage is applied to electrode 365 with respect to electrode 355 (e.g., when the diode layer is forward biased), electrons cross from the electron transport layer 330 towards the hole transport layer 320, recombining with holes in the active layer 340. This recombination results in the isotropic emission of light of a wavelength λ (e.g., electroluminescence). The wavelength(s) λ(s) of the emission depends on the bandgap of the transport 320/330 and active layer 340 materials (e.g., semiconductors, or organic semiconductors). For displays, the materials are chosen so that λ(s) are of visible wavelengths of light (e.g., red light, green light, or blue light, or between 390 to 700 nm).

Bottom reflector 350 is highly reflective at λ(s) (e.g., the reflectance, R, is above 0.9 or 0.8 for the wavelength band of operation), while the top reflector 360 is partially transmissive to allow for emission of perpendicular light in principal direction 240 (e.g., R is 0.9 or 0.8 or less and T is 0.01 or more). Alternatively, or additionally, the top reflector can be designed with an aperture that allows partial transmission of emitted light.

The top 360 and bottom 350 reflectors form a Fabry-Perot optical cavity. The cavity enhances spontaneous emission from active region layer 340 to the modes of the cavity, resulting in higher spectral purity of the emitted wavelength $\lambda$. The cavity also makes the emission more anisotropic (e.g., substantially collimated) by enhancing optical modes that are perpendicular to the plane of diode layer 310 (e.g., light with principal direction 240). In other words, the cavity allows μRCLED 300 to emit substantially collimated light in a principal direction 240 that is perpendicular to the plane of the diode layer 310.

The thickness of the optical cavity in the z-direction can be designed to increase the spectral purity the emitted wavelength of the active region. The thickness of diode layer 310 defines the thickness (or length) of the optical cavity (L). To limit the emission of active layer 340 to a narrower spectral band around $\lambda$, the length of the optical cavity can be an integer multiple of $\lambda/2$ so that $L=N\cdot\lambda/(2\cdot n)$, where N is an integer between 1 and 10 and $\lambda$ is the optical wavelength of the spontaneous emission of active layer 340 and n is the refractive index of the diode layer. For example, for a red subpixel 210, where $\lambda$ is centered around 625 nm, and the refractive index is 2, the optical cavity length (or thickness) can be between 150 nm and 1 μm. In general, the optical cavity length of μRCLED 300 for visible emissions can be between 100 nm and 10 μm. The resulting spectral bandwidth can have a standard deviation between 10 and 50 nm from $\lambda$.

One or both of reflectors 350 and 360 can be deposited reflective metal layers, Distributed Bragg Reflectors (DBRs), or other reflective structures. DBRs are formed from multiple layers of alternating materials with varying refractive index, resulting in periodic variation in the effective refractive index in the structure. Each DBR layer boundary causes a partial reflection of an optical wave (e.g., of emitted light). When the thickness of each layer is approximately equal to $\lambda/4n$, the many reflections of the emitted waves combine to result in constructive interference, and the DBR layers act in combination as a high-quality reflector. The range of wavelengths that are reflected is called the photonic stopband. In other words, within this range of wavelengths, light is "forbidden" from propagating in the structure.

For example, a multilayer DBR can be a quarterwave stack composed of a plurality of pairs (or periods) of semiconductor layers, with a number of pairs ranging from 10 to 40. One semiconductor layer in each pair has a higher index of refraction than the other semiconductor layer of the pair. The thickness of each semiconductor in the pair equals $\lambda/4n$, wherein $\lambda$ is the optical spontaneous emission wavelength of the active region of the LED and n is the refractive index of the semiconductor material. For a device with an active region layer 340 spontaneously emitting at $\lambda=0.87$ μm, such as GaAs, a quarterwave stack of pairs of such semiconductors as GaAs and AlAs with refractive indices of 3.64 and 2.97, respectively, can consist of 62 nm thick GaAs layer and 73 nm thick AlAs layer while a stack of AlAs and $Al_{0.05}Ga_{0.95}As$ can consist of pairs of layers 73 nm and 60 nm thick each, respectively. In a specific example, the DBR can be 30 pairs of $n^+$-type ($5\times10^{17}$-$5\times10^{18}$ $cm^{-3}$) semiconductor layers forming the DBR mirror structure, each pair of the stack consisting of a 73 nm thick layer of $n^+$-AlAs and 60 nm thick layer of $Al_{0.14}Ga_{0.86}As$.

In some embodiments, the materials of the DBR mirror can be selected to reduce losses such as the absorbance of the diode layer's 310 electroluminescent emission by the DBR's multilayer mirror structure.

Semiconductor DBRs can be epitaxially grown from semiconductor substrate 230 (e.g., using metal organic vapor phase epitaxy (MOVPE), metal organic chemical vapor deposition (MOCVD), molecular beam epitaxy (MBE) or hydride vapor phase epitaxy (VPE)). For example, a semiconductor DBR can be epitaxially grown on a highly doped semiconductor substrate 230 that also provides as an ohmic contact for electrodes 355 or 365 (e.g., as a contact layer). For example, substrate 230 can be a heavily doped $n^+$-type (or p-type) III-V or II-VI semiconductor, such as GaAs or AlGaAs. The thickness of the substrate can be from 100 μm to 500 μm and the doping concentration of the substrate can range from $1\times10^{17}$ to $1\times10^{19}$ $cm^{-3}$. In some applications, the substrate can be first grown on a master substrate of silicon, which is in common to a number of devices grown on the master substrate.

DBRs can also be formed from deposition of alternating layers using as atomic layer deposition, chemical vapor deposition (CVD), physical vapor deposition (PVD), ion beam sputtering, magnetron reactive sputtering, and plasma-ion-assisted deposition. For example, the top reflector in μRCLED 300 can be a DBR deposited on a previously fabricated diode layer 310 via sputtering.

In some embodiments, the DBR is an air-gap DBR. Air-gap DBRs alternate layers of air and a material, such as a semiconductor material. They can achieve higher reflectivity with fewer layers due to the higher contrast in refractive index. For example, such air gaps may be formed by selective wet or photochemical etching of sacrificial alternating layers in a semiconductor DBR. In some embodiments, the etching process can be halted before the entire sacrificial layer is removed, leaving behind support structures composed of the sacrificial layer material. In some embodiments, support posts are deposited between alternating semiconductor DBR layers using photolithography or other nanofabrication methods.

In some embodiments, transport layers 320/330 and active layer 340 are III-V or II-VI semiconductor materials, such as GaAs or AlGaAs. Additionally, or alternatively, the semiconductor materials can also include a single group four element (e.g., C, Si, Ge, Sn, etc.), or can include a compound with group 2 elements (Be, Mg, Ca, Sr, etc.), group 3 elements (B, Al, Ga, In, etc.), group four elements, group 5 elements (N, P, As, Sb, etc.), group 6 elements (O, S, Se, Te, etc.) or any other suitable composition. Example compounds include: AlGaInP, AlGaN, AlGaInN, Al(GaIn)AsP, AlAs, GaAs, GaAsP, GaP, GaN, GaAlAs, InGaN, SiC, ZnO or the like.

With a semiconductor diode layer 310, the electron transport layer 330 can be n-doped and the hole transport layer 320 can be p-doped. In some embodiments, the transport layers can be $Al_xGa_{1-x}As$, where x ranges from 0.1 to 0.4. For example, n-doped layer 330 can be n-type $Al_{0.30}Ga_{0.70}As$ and p-doped layer 320 can be p-type $Al_{0.30}Ga_{0.70}As$. Active layer 340 may be lightly n- or p-doped (e.g., $1\times10^{16}$-$5\times10^{17}$ $cm^{-3}$ GaAs), or left undoped. Active layer 340 is selected to have a narrower bandgap than transport layers 320, 330. For example, the active layer can be a narrow bandgap semiconductor material, such as AlIn-GaP.

Transport layers 320/330 can each be between 0.1 μm and 8 μm thick (e.g., in z-direction in FIG. 3A). The total thickness of diode layer 310 can be between 3 μm and 10

μm. In some embodiments, the total thickness of diode layer 310 can be 10 μm or less, 5 μm or less, or 3 μm or less. The thickness can be tuned to define a desired optical cavity length, as detailed above. In a specific example, diode layer 310 includes an electron transport layer 330 of n+-Al$_{0.20}$Ga$_{0.80}$As ($5\times10^{17}$ cm$^{-3}$) about 140 nm thick, a lightly doped ($5\times10^{16}$ cm$^{-3}$) active layer 340 of p−-GaAs about 10 nm thick, and a hole transport layer 320 of p+-Al$_{0.30}$Ga$_{0.70}$As ($5\times10^{16}$ cm$^{-3}$) about 80 nm thick.

As noted previously, mLEDs are extremely small. The lateral dimension of diode layer 310 (e.g., in x-direction in FIG. 3A) is generally 100 μm or less, and can be 50 μm or less, 20 μm or less, 10 μm or less. Small lateral dimensions means that a number of μLEDs 225 can be used in a single subpixel 210, while maintaining an overall low pixel size and high resolution.

However, without being bound to theory, such small lateral dimensions can also lead to appreciable decreases in quantum efficiency in active layer 340 due to surface charge trapping and recombination. Charge trapping and recombination may be the product of undesired interfacial chemical groups such as O—H groups, dangling bonds, etc., and may result in usable energy being converted into heat. This is particularly apparent in micro-scale devices—especially red emitting micro-scale devices—where charge carrier diffusion lengths approach the lateral dimensions of the device. U.S. application Ser. No. 15/005,872, entitled High-Efficiency Light Emitting Diode, and incorporated in its entirety herein by reference, discloses diode layer 310 design modifications that can reduce surface charge trapping and recombination by preventing electrons/holes in active layer 340 from reaching the surface of the semiconductor material.

All semiconductor layers in diode layer 310, just like semiconductor-based DBRs 350 and/or 360, can be epitaxially grown from a semiconductor substrate 230 (e.g., using MOVPE, MOCVD, MBE, or VPE). In some embodiments, the bottom DBR, diode layer, and optionally the top DBR can be grown on a sacrificial epitaxial substrate. The substrate can be subsequently etched, and the DBR-diode-DBR or DBR-diode stacks can be released from the substrate. Such stacks can be released into solution or mechanically detached with a resin stamp. The stacks can then be arrayed on a non-native substrate using chemical patterning or mechanical deposition techniques (e.g., stamping). With the use of sacrificial epitaxy and arrangement of diode stacks on a non-native substrate, stacks with different emissive bandwidths (e.g., those corresponding to R/G/B subpixels) can be placed adjacently in a single array, for example, an array making up all subpixels 210 of pixel 130. In the case of DBR-diode stacks arrayed on a non-native substrate, top reflector 360 (e.g., a second DBR) can be deposited on top of diode layers 310 of the stacks using sputtering with photolithography patterning and liftoff techniques.

The contact electrodes 355, 365 can be formed from any material that is sufficiently conductive to produce an ohmic contact with the transport layers. For example, the electrode can be a metal, such as Indium, Ag, Al, Ni, Ti, Au—Zn and Au—Be. The electrodes can be formed by known microfabrication methods, including lithographic patterning, deposition, and etching techniques. The electrodes can be 1 μm to 10 μm in thickness.

Electrodes 355, 365 can be designed so as to not interfere with the optical and emissive properties of μRCLED 300. For example, in some embodiments, especially when reflector layer 350/360 is not itself conductive, electrodes 355, 365 can be applied to a small, non-centralized area of the diode layer and can make contact with the transport layer(s) 320/330 using vias 366 formed through the reflector layer (s), as shown in FIG. 3A. Alternatively, or additionally, a non-central part of the reflector layer(s) can be removed (e.g., using photolithography and/or selective etching techniques) and replaced with an electrode material.

If reflector layer 350/360 is itself conductive, then electrodes 355/365 can make direct contact with reflector layer 350/360, instead of diode layer 310. In some embodiments, conductive reflector layer 350/360 can also itself act as an electrode.

In some embodiments, the top electrode 365 is reflective. If electrode 365 is reflective, it can be used instead of the top 360 and/or bottom 350 reflector layers to form the optical cavity.

In some embodiments, top electrode 365 is transmissive to emitted wavelength λ. In some embodiments, this transmissive electrode 365 can be applied to the entire planar dimension of top reflector 360 without affecting the optical properties of μRCLED 300.

In some embodiments, a highly doped contact layer is provided between contact electrodes 355/365 and the transport layers 320/330 to establish a non-alloyed ohmic contact. For example, the contact layer can be an n+-type or p type III-V or II-VI semiconductor, such as GaAs or AlGaAs. The thickness the contact layer can range between 3 nm to 50 nm and the doping of the contact layer can be between $1\times10^{17}$ to $1\times10^{20}$ cm$^{-3}$. In some embodiments, the contact layers can cover the entire top (or bottom) transport layer without interfering with the optical properties of μRCLED 300. In some embodiments, the top 360 and/or bottom 350 reflector are sufficiently electrically conductive to act as contact layers.

Although the above embodiments were described in terms of semiconductor transport 320/330, contact, and active 340 layers, one or more of those layers can be substituted with an organic electronic material. Organic electronic materials include conductive polymers such as polyacetylene, polypyrrole, polyaniline, and their copolymers. Poly(p-phenylene vinylene) and its derivatives, and polyfluorene, can be used as electroluminescent semiconducting polymers.

An OLED (organic light-emitting diode) is composed of a thin film of organic material (e.g., active layer 340) that emits light under stimulation by an electric current. An OLED can include an anode (e.g., electron transport layer 330), a cathode (e.g., hole transport layer 320), an OLED organic material (e.g., active layer 340), and a conductive layer.

OLED organic materials can be categorized into two major families: small-molecule-based and polymer-based. Small molecule OLEDs (SM-OLEDs) include organometallic chelates(Alq3), fluorescent and phosphorescent dyes, and conjugated dendrimers. Fluorescent dyes can be selected according to the desired range of emission wavelengths; compounds like perylene and rubrene can be used. Devices based on small molecules can be fabricated by thermal evaporation under vacuum. While this method enables the formation of well-controlled homogeneous film, it can be limited by high cost and limited scalability.

Polymer light-emitting diodes (PLEDs), similar to SM-OLED, emit light under an applied electric current. Polymer-based OLEDs can be more efficient than SM-OLEDs requiring a comparatively lower amount of energy to produce the same luminescence. Common polymers used in PLEDs include derivatives of poly(p-phenylene vinylene) and polyfluorene. The emitted color can be tuned by substitution of different side chains onto the polymer backbone or modifying the stability of the polymer. Polymer-based OLEDs can be processed using solution-based techniques. Compared to thermal evaporation, solution based methods can be more suited to creating films with large dimensions.

Figure 3B:
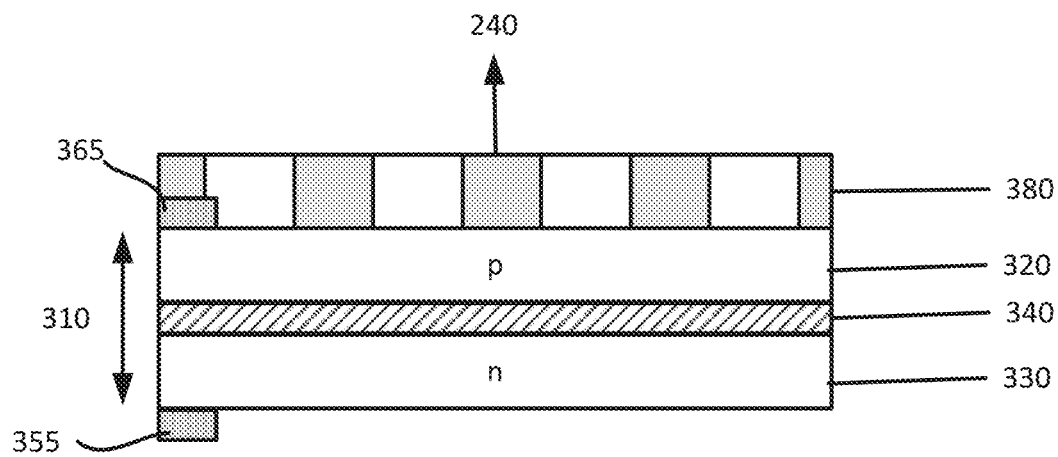
FIG. 3B is a schematic cross-section of an embodiment of a μLED with a photonic crystal.
Figure 3B:
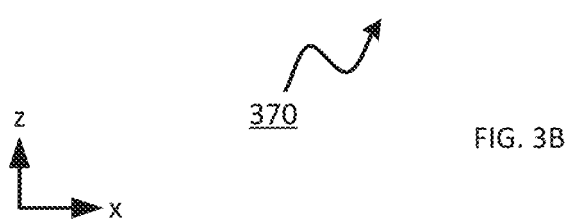

Although the prior discussion focused on μRCLEDs as emitters, other μLEDs 225 that can provide substantially collimated light are contemplated. For example, FIG. 3B shows a different example of such a μLED structure: a photonic crystal μLED 370. Instead of using reflectors to form an optical cavity as shown in FIG. 3A, diode layer 310 is positioned adjacent to a 2D photonic crystal 380 in μLED structure 370. The dimensions and material considerations are otherwise similar to μRCLEDs 300. Electrodes 355 and 365 still provide forward bias to stimulate emission in active layer 340 of diode layer 310. Instead of enhancing perpendicular optical modes (as in a μRCLED 300 cavity), the crystal in μLED structure 370 can be designed to suppress optical modes in the plane of the diode layer. Thus, both μLED structures 300 and 370 generate light of wavelength λ emitted in a principal perpendicular direction 240 from active layer 340.

Photonic crystals, such as crystal 280, are composed of periodic dielectric, metallo-dielectric—or even superconductor microstructures or nanostructures—that affect electromagnetic wave propagation in a similar way to how a periodic potential in a semiconductor crystal affects electron motion by defining allowed and forbidden electronic energy bands. Photonic crystals contain regularly repeating regions of high and low dielectric constant. Photons (behaving as waves) either propagate through this structure or not, depending on their wavelength. Wavevectors that propagate are called modes, and groups of allowed modes form bands. Disallowed bands of wavelengths are called photonic band gaps.

Photonic crystals can be fabricated for one, two, or three dimensions. One-dimensional photonic crystals, such as DBRs discussed above, can be made of layers deposited or stuck together. Two-dimensional crystals can be made by photolithography, or by drilling periodically-spaced holes in a suitable substrate. Holes may be drilled in a substrate that is transparent to the wavelength of radiation that the bandgap is designed to block. Triangular and square lattices of holes can be employed.

For photonic crystal μLED 370, the photonic bandgap can be chosen exclude the emission wavelength λ of the active region in order to allow for the transmission of such light through the top of the μLED structure 370. The bandgap can include modes of emitted light which are not perpendicular to diode layer 310. Specifically, the resulting emitted light has a principal direction 240 perpendicular to diode layer 310 and is substantially collimated to an angular distribution of $\theta_{1/2}$ of 15° or less, as discussed previously.

FIGS. 3A-3B provide two examples of μLEDs 225 that can produce substantially collimated light emitted in a perpendicular principal direction 240 from an organic or inorganic diode layer 310. As noted in reference to FIG. 2C, light from each μLED 225 can be directed into specific directions by light directing elements 262. Other techniques for directing substantially collimated light from emitters are also contemplated, however.

Figure 4:
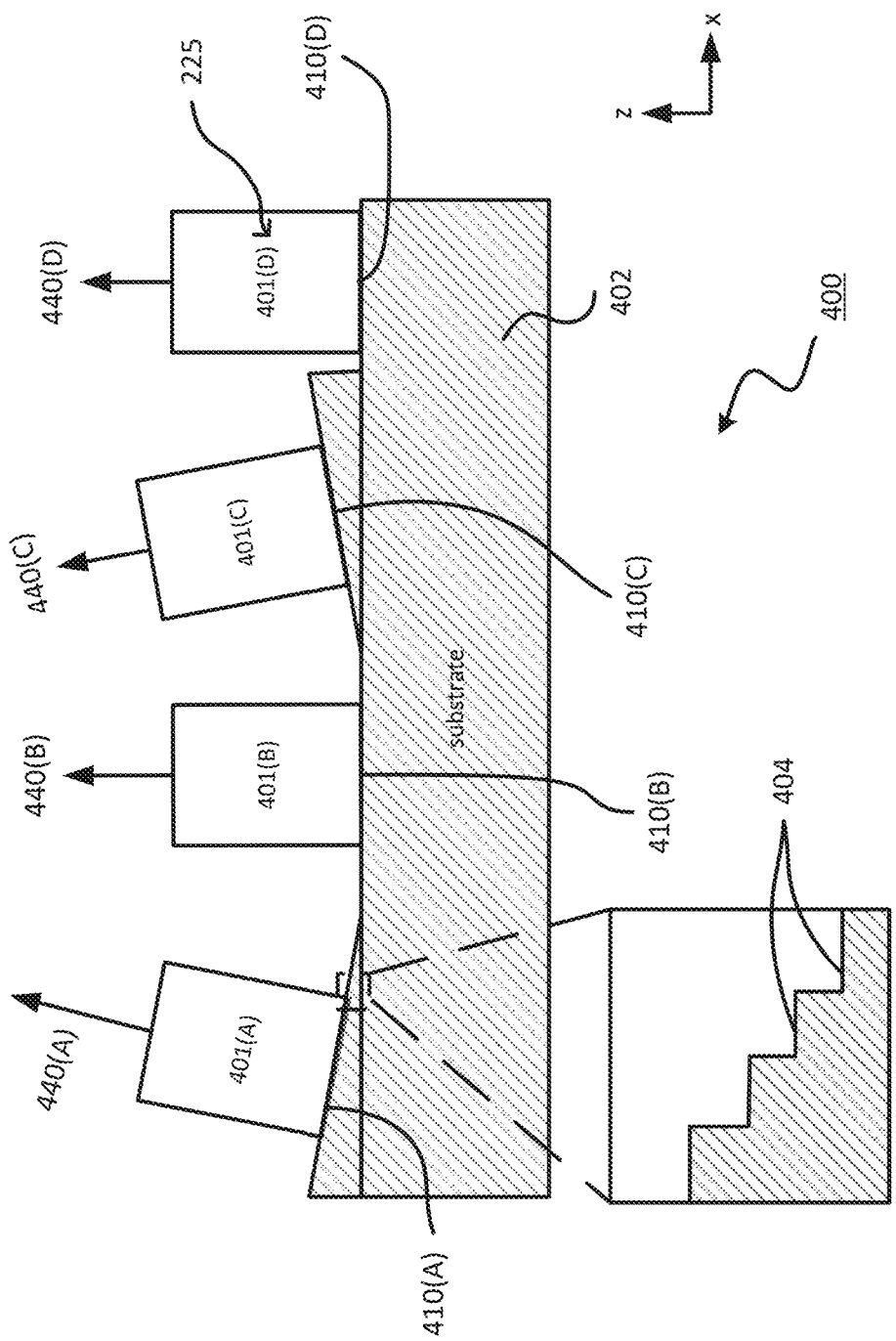
FIG. 4 is a schematic cross-section of an array of μLEDs on a tiered (or terraced) substrate.

For example, in some embodiments, the substrate of a μLED 225 array can be structured to provide control of directionality. As shown in FIG. 4, an array 400 includes μLEDs 225 (individually 401(A)-(D)) on structured substrate 402. μLEDs 401(A)-(D) emit light in respective principal directions 440(A)-(D), each direction substantially perpendicular to the layers forming the μLED, as discussed above. However, the surface of substrate 402 that supports μLEDs 225 is not a planar surface, but includes inclined portions 410(A) and 410(C) along with portions 410(B) and 410(D) that lie parallel to the x-y plane. Inclined portions 410(A) and 410(C) can be formed by terraces 404, as shown in the inset in FIG. 4. As shown, the terraces are much smaller than the size of the μLEDs, so that the terraced surface presents an effectively flat surface on which the μLEDs are placed. The principle direction of each respective μLED is tilted by an angle corresponding to the wedge angle of each inclined portion 410(A) and 410(C). Accordingly, the strategic placement of μLEDs 225 on differently inclined portions results in light being oriented into different viewing directions 440(A)-(D).

Substrate terracing can be formed, for example, by selective chemical etching of substrate 402 (e.g., a semiconductor substrate). μLEDs 401(A)-(D) can be arrayed on the substrate via soft lithography transfer methods, such as stamping. Such methods can allow for adjacent placement of elements 401 that emit light at different wavelengths, for example as elements in adjacent subpixels 210.

In some embodiments, a single light directing element can be used to direct light emitted from a number of light emitting elements into a corresponding one of a number of different directions. Advantageously, using a single light directing element for multiple emitters can the decrease the overall number of light directing elements, lowering costs, simplifying synthesis, and/or reducing design constraints.

Figure 5A:
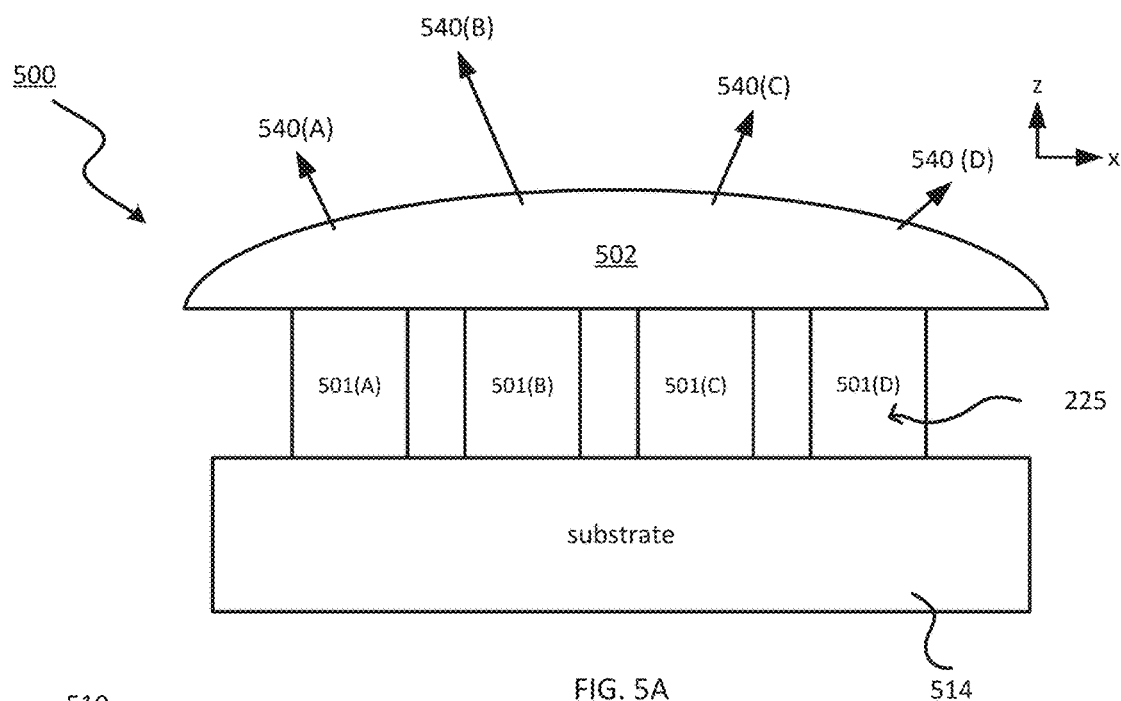
FIG. 5A is a schematic cross-section of a device including an array of μLEDs optically coupled to a single light directing lens.

For example, FIG. 5A shows a device 500 with a number of μLED structures 225 on substrate 514. A single refractive light directing element 502 (e.g., a lens) directs the light emitted from the μLEDs 501(A)-(D) into different respective principal directions 540(A)-(D). Alternatively, or additionally, a single diffractive light directing element (e.g., a diffractive lens or holographic optical element) can be used to direct the light emitted from a number of μLEDs into different directions.

Figure 5B:
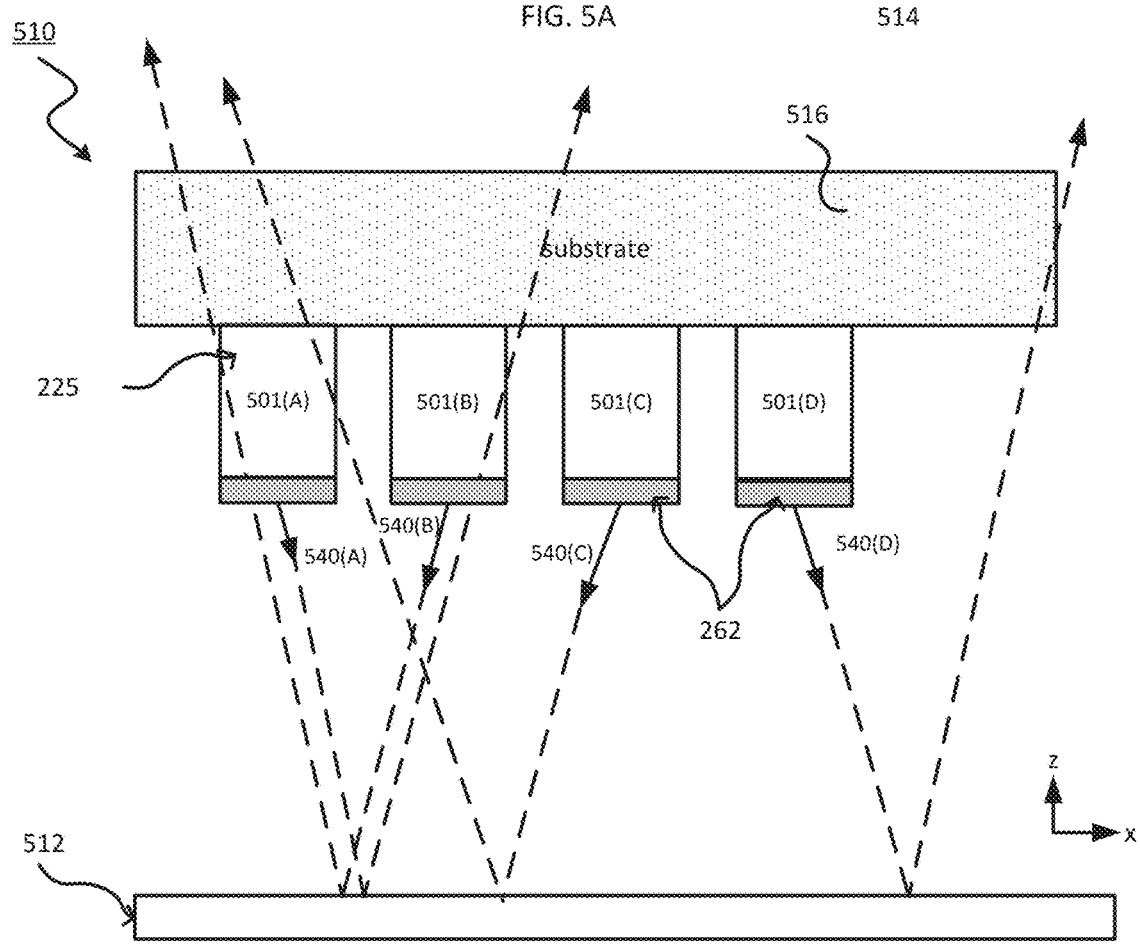
FIG. 5B is a schematic cross-section of a device including an array of μLEDs optically coupled to a light directing mirror.

While the foregoing examples have all featured light emitters that emit light towards the viewing side of the display (e.g., using transmissive light directing element(s) to steer the light), other arrangements are also possible. For example, light field pixels can utilize emitters that face towards the back of the display and use one or more reflective light directing elements to reflect emitted light towards the viewing side. Referring to FIG. 5B, a device 510 includes μLEDs 501(A)-(D) with respective refractive light directing elements 262 on transmissive substrate 516. Light emitted from μLEDs 501(A)-(D) is directed into different respective principal directions 540(A)-(D) by light directing elements 262, and is reflected form a single reflective light directing element 512 (e.g., a mirror). The light reflecting element 512 allows light from a number of directing elements to be re-directed and emitted through transparent substrate 516 towards the viewer(s).

As noted previously, light field display 110 can achieve a high display resolution and a high angular resolution by taking advantage of the small lateral dimension of each μLED structure 225 (e.g., under 100 μm). A high angular resolution is achieved because many such small μLEDs 225 can fit into a single subpixel 210 in display 110 (e.g., in 1D or 2D arrays). However, while the foregoing embodiments feature a single light emitter for each discrete light emission direction in a light field display subpixel, temporal multiplexing techniques can also be used to increase the angular resolution of each subpixel or simplify the structure of a light field subpixel by using fewer light emitters to achieve a desired angular resolution. Temporal multiplexing involves using a single light emitter to sequentially direct light into more than one angular range during each image frame.

Due to the switching speed and high brightness of the µLEDs, each can generate sufficient optical power in a fraction of the duty cycle for each frame. Thus, each µLED can be used to direct light into multiple directions for each frame. As a consequence, temporal multiplexing allows display 110 to use a fraction of the µLEDs it would otherwise need to generate the same angular display resolution.

In addition to decreasing the number of µLED structures 225 required for maintaining angular resolution, a multiplexed display can have several other advantages compared to a non-multiplexed display. They can require fewer wires or electrical connections and simpler driving electronics. They can also lead to reduced cost and/or reduced power consumption.

Figure 6A:
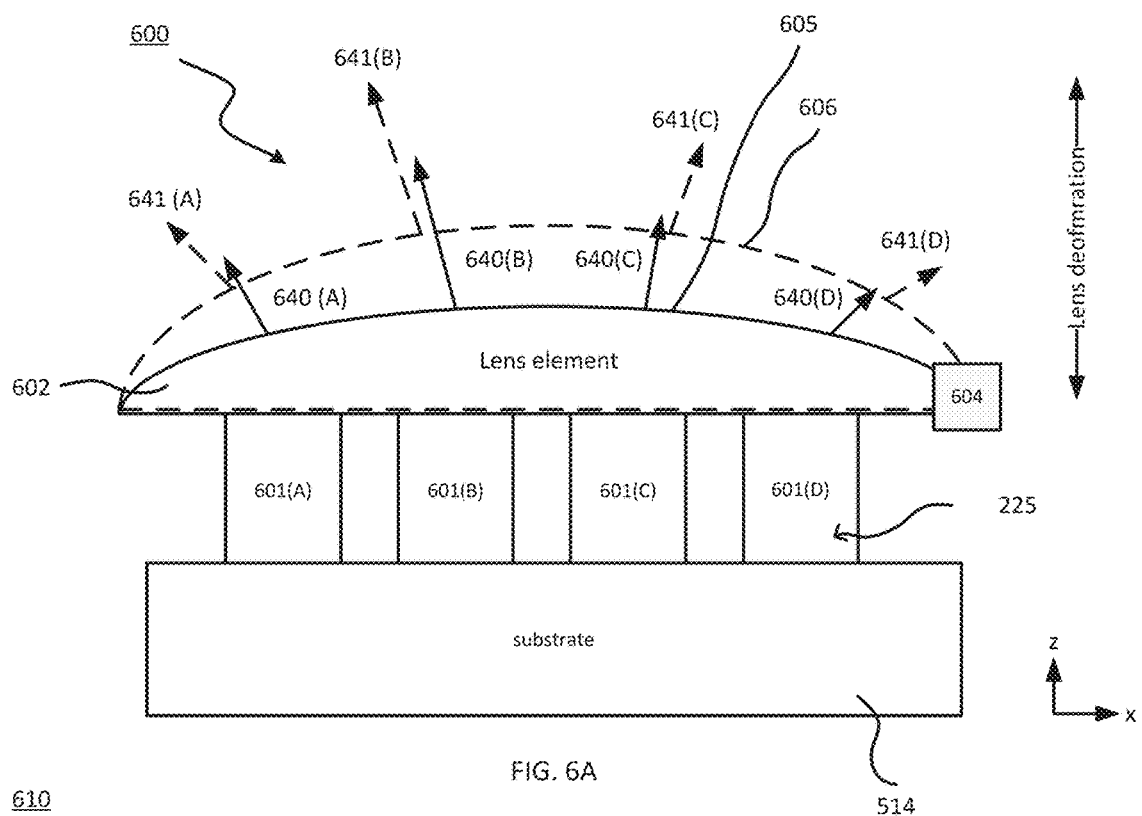
FIG. 6A is a schematic cross-section of a device including an array of μLEDs optically coupled to a deformable lens.
Figure 6B:
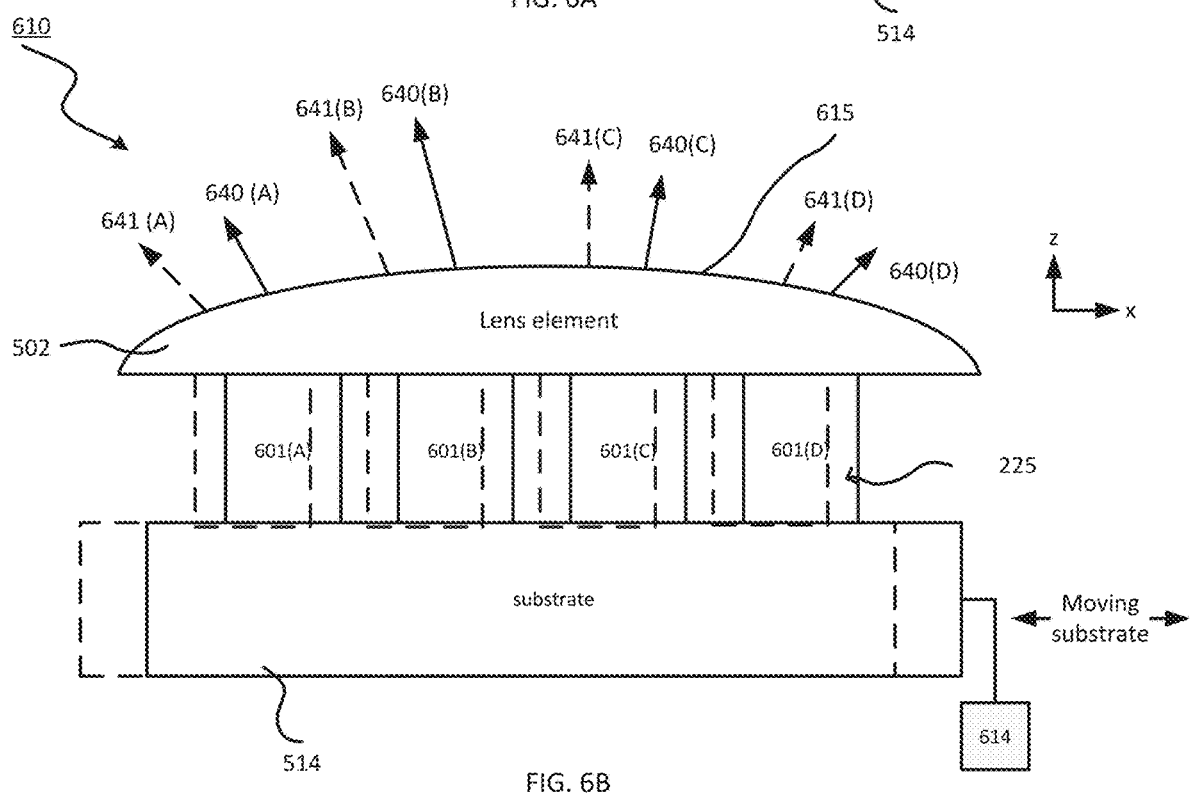
FIG. 6B is a schematic cross-section of a device including an array of μLEDs on a moving substrate optically coupled to a lens.
Figure 6C:
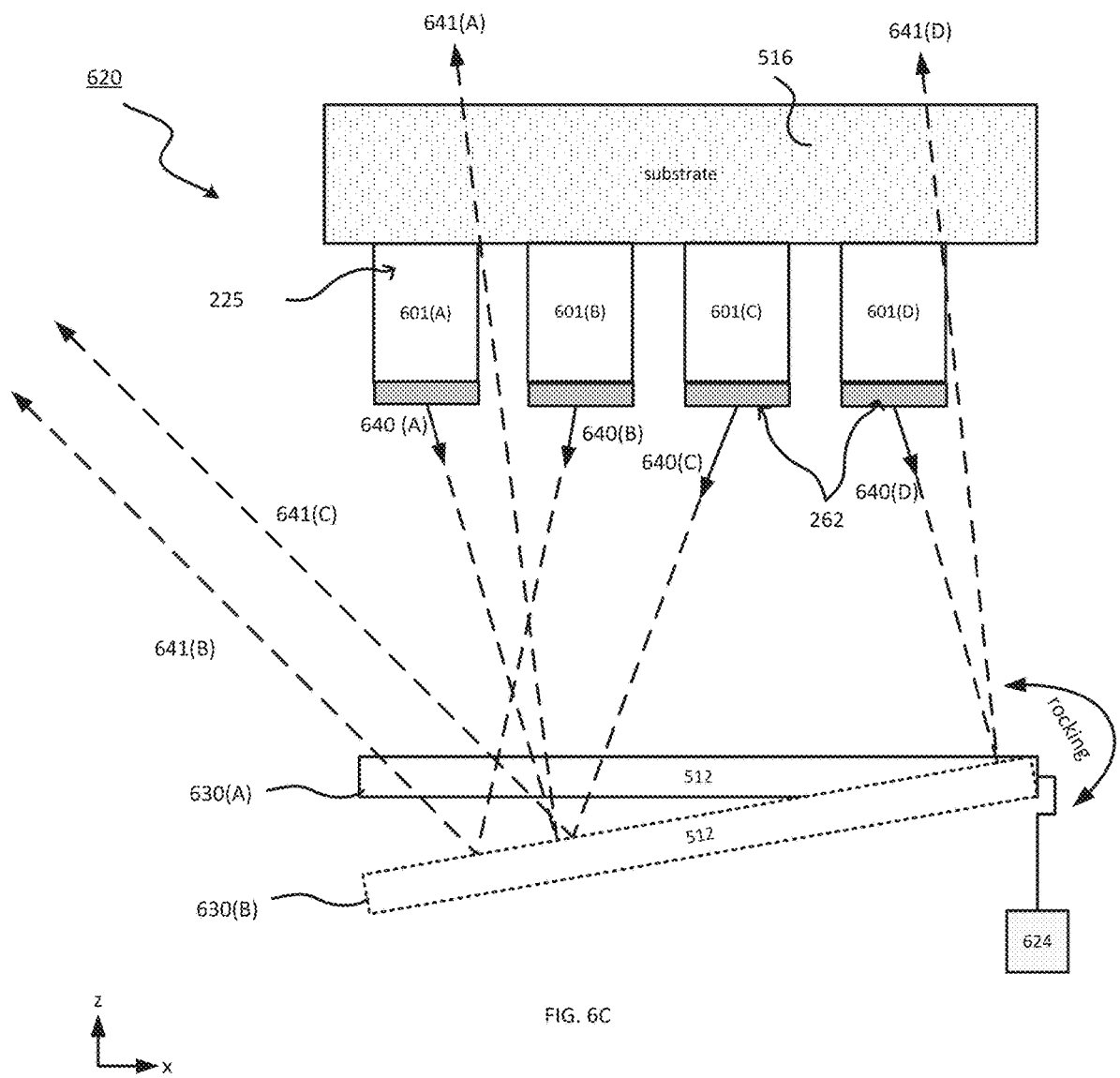
FIG. 6C is a schematic cross-section of a device including an array of μLEDs optically coupled to a movable mirror.

FIGS. 6A-6C show different embodiments of light field pixel structures capable of temporal multiplexing in light field display 110. Referring to FIG. 6A, device 600 includes µLEDs 601(A)-(D) arrayed on a substrate 514. Due to the varying local curvature of its exit surface 605, lens 602 directs light emitted from µLED 601(A)-(D) into respective principal directions 640(A)-(D).

Actuator 604 causes the curvature of the exit surface 605 of lens 602 to change to a different curvature, e.g., 606. This change in curvature results in a different local incident angle of emitted light at the exit surface and a corresponding change in the refraction of light emitted from µLEDs 601 (A)-(D), from initial respective principal directions 640(A)-(D) into modified principal directions 641(A)-(D). Thus, deformation of lens 602 can be used to temporally multiplex the display, using controller 120, and allow each light emitting element to direct light into multiple directions (e.g., 640(A) and 641(A)) in a single display frame.

Lens 602 has material properties that allow for predictable, reversible, and fast deformation appropriate for multiplexing (e.g., greater than 30-60 frames per second). Such directing elements 602 can be mechanically or electrically tunable. For example, an electroactive elastomer-liquid lens system or dielectric elastomer actuators can be used.

Additionally, or alternatively, the optical properties (e.g., refractive index) of a light directing element can be changed without physical deformation (e.g., using electro-optic effects). For example, liquid crystals can provide controlled refractive index changes without mechanical movement upon application of electric signals. Such changes can be used for temporal multiplexing, and can avoid mechanical strain caused by repetitive deformation of the material.

While device 600 achieves temporal multiplexing by actuating the light directing element, other adjustment schemes are also possible. For example, alternatively, or additionally, the light emitters can be moved relative to the light directing element during each frame. Referring to FIG. 6B, a device 610 includes µLEDs 601(A)-(D) arrayed on a substrate 514. Lens 502 (or some other light directing element) directs light emitted from µLEDs 601(A)-(D) into respective principal directions µLEDs 640(A)-(D).

Temporal multiplexing is achieved by using actuator 614 to move substrate 514 with respect to the light directing element 502. This movement results in a different local incident angle of emitted light at the exit surface 615 of lens 502 and a corresponding change in the refraction of light emitted from µLEDs 601(A)-(D), from initial respective principal directions 640(A)-(D) into modified principal directions 641(A)-(D).

Additionally, or alternatively, relative movement between the light directing element and the light emitting element array can be achieved in various ways. For example, substrate 514 can be placed on a piezo-electric stage and the relative movement can be electrically controlled.

Temporal multiplexing can also be achieved using a MEMS mirror. For example, referring to FIG. 6C, a device 620 includes µLEDs 601(A)-(D) with respective refractive light directing elements 262 arrayed on a transmissive substrate 516. Light emitted from µLEDs 601(A)-(D) is directed into different principal directions (640(A)-(D) respectively) by the light directing elements 262, and is reflected form a single reflective light directing element 512 (e.g., a mirror). The light reflecting element 512 allows light from a number of directing elements to be re-directed through transparent substrate 516.

In order to achieve temporal multiplexing, actuator 624 controls the tilt of light reflecting element 512, from initial position 630(A) to a different position, e.g. 630(B), changing the principal direction of light emitted from µLEDs 601(A)-(D), e.g., to µLEDs 641(A)-(D) respectively. Any electrically-tunable actuation mechanism can be used for actuator 624. For example, microelectromechanical systems (MEMs) can be used. MEMs devices use miniaturized mechanical and electro-mechanical elements (e.g., devices and structures) made using the techniques of microfabrication.

Additionally, or alternatively, the individual refractive light directing elements 262 can be eliminated from device 620, and the single mirror 512 replaced with a micro-mirror spatial light modulator (SLM). Each micro-mirror of the SLM can be used to change the direction of light emitted from a single µLED. An example of such an SLM system is the Digital Micromirror Device (DMD): a semiconductor-based light switch array of thousands of individually addressable, tiltable, mirror-pixels.

Although the above embodiments are shown as using µLED structures 225, any light emitting elements of similar dimensions that can produce substantially collimated light can be used in light field displays 110 disclosed herein. For temporal multiplexed displays, light emitting elements with similar intensity and switching speeds to the described µLED structures 225 can be used.

The light field display subpixels described above generally involve the use of incoherent light. However, more generally, light field pixels that use coherent light sources also can be used. For example, using coherent light, a light field subpixel can variably spatially-modulate a phase of a wavefront emitted from the pixel so that, in the far field, the light intensity from the subpixel varies as a function of viewing angle. Collectively, the subpixels operate to display a light field image as the described in the embodiments presented above.

Figure 7A:
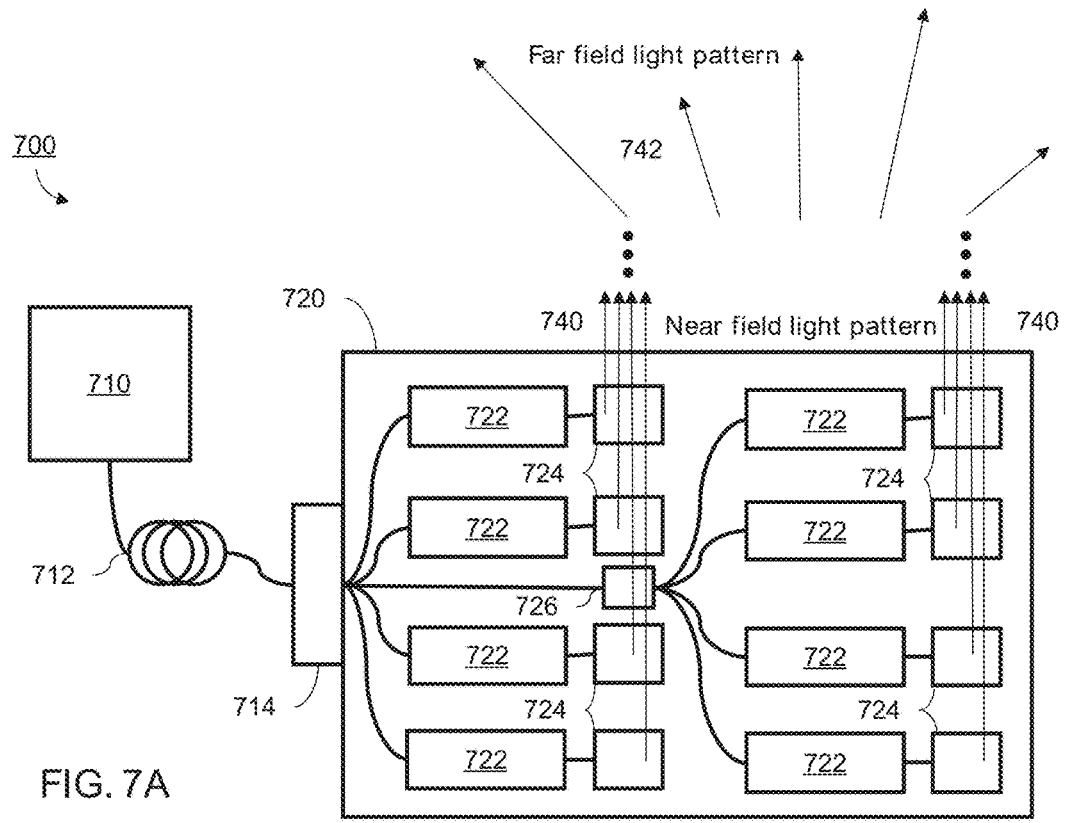
FIG. 7A is a schematic diagram of a light field subpixel that uses a coherent light source.

An example of an apparatus 700 including such a light field subpixel is shown in FIG. 7A. Here, a light field subpixel 720 receives coherent light (e.g., polarized coherent light) from a light source 710 via a waveguide 712 (e.g., a fiber waveguide) and an input coupler 714.

Subpixel 720 includes multiple (in this case, eight) phase-shifting elements 722, which are arranged to receive light from input coupler 714 via waveguides. Each phase-shifting element 722 introduces a variable phase shift to the coherent light it receives from input coupler 714 and to output light to a corresponding output coupler 724, which emits the phase-shifted light from subpixel 720. Subpixel 720 also includes a light-splitter 726 that facilitates distribution of light from input coupler 714 to some of the phase-shifting elements.

Light field subpixel 720 emits in the near field, via output couplers 714, a collection of coherent wavefronts (illustrated by rays 740) which are phase-shifted relative to each other by the phase shift introduced by phase shifting elements 722. In the far field, interference between the wavefronts results in a varying intensity of the subpixel depending on which viewing angle the pixel is viewed from (illustrated by rays 742).

In general, any suitably compact variable phase shift element can be used. For example, phase shifting elements 722 can be composed of an electro-optic waveguide modulator, which can vary the optical path length of the light in the waveguide, by application of an electric field across the waveguide. Non-linear optical crystals (e.g., lithium niobate) or nonlinear optical organic polymers can be used in such modulators. Additionally or alternatively, phase shifting elements 722 can use thermo-optic effects (e.g., refractive index change with temperature). Similarly, any suitable outcoupling element can be used, such as a grating, photonic crystal, a mirror, or a lens.

In some implementations, light source 710 supplies light to multiple subpixels. Generally, at least one light source for each subpixel color is used.

Figure 7B:
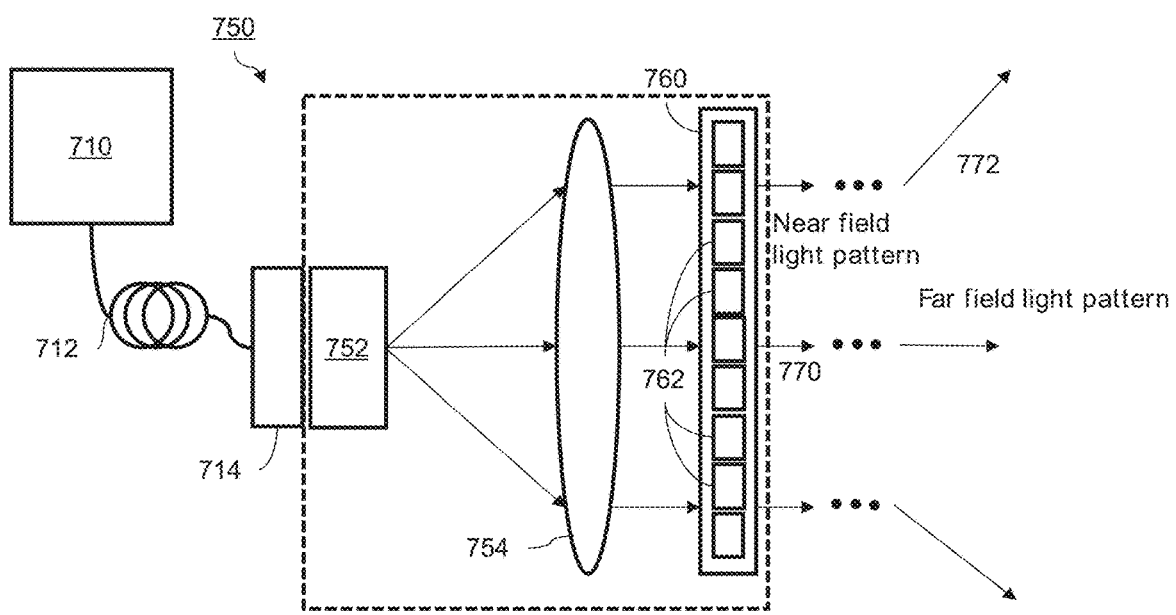
FIG. 7B is a schematic diagram of another light field subpixel that uses a coherent light source.

FIG. 7B shows another example of a light field subpixel 750 that uses coherent light source 710. Here, subpixel 750 includes a spatial phase modulator 760. Like apparatus 700, subpixel 750 receives coherent light (e.g., coherent polarized light) from light source 710 via a waveguide 712 and input coupler 714. Subpixel 750 further includes a beam shaper 752 and collimator 754 which function to spread and collimate light from input coupler 714 to provide a planar wavefront that fills the aperture of spatial phase modulator 760.

Spatial phase modulator 760 includes a spatial array of variable phase delay elements 762 which, collectively, introduce variable phase delay across an incident wavefront so that the wavefront emitted (770) from the subpixel takes on the desired far field intensity pattern (772). Spatial phase modulator 760 is analogous to a switchable phase grating or switchable hologram, in which the emitted wavefront is diffracted in a manner that results in the desired far field light intensity pattern. Although depicted as a one dimensional array, two dimensional arrays of phase delay elements 762 are also possible.

Spatial phase modulator 760 can utilize a variety of electro-optic technologies for introducing a variable phase shift to a wavefront incident across the modulator. For example, a liquid crystal device can be used. For instance, spatial phase modulator 760 can include a layer of a liquid crystal material between transparent electrode layers, patterned to allow for the orientation of LC molecules in the layer to be separately controlled at each element by application of a suitable voltage across each element. For polarized light traversing the LC layer, the phase of the light exiting modulator 760 will depend on the amount of retardation experienced in the LC layer, which in turn depends on the LC molecules orientation. Other electro-optic materials, such as crystals which exhibit the Pockels effect or Kerr effect, can also be used. For example, spatial light modulator 760 can include such as lithium niobate or gallium arsenide and in other noncentrosymmetric media such as electric-field poled polymers or glasses.

Light field subpixels 720 and 750 can be formed using integrated optics, free-space optics, fiber optics, alone or in combination. For example, light field subpixel 720 can be formed using integrated optics (e.g., the subpixel can be integrated in a monolithic substrate using fabrication techniques common to wafer processing) but coupled to light source 710 using fiber optics. Light field subpixel 750 can be formed using a combination of free space optics (e.g., beam shaper 752 and collimator 754) and integrated optics (e.g., spatial phase modulator 760), and coupled to light source 710 using fiber optics.

Figure 8A:
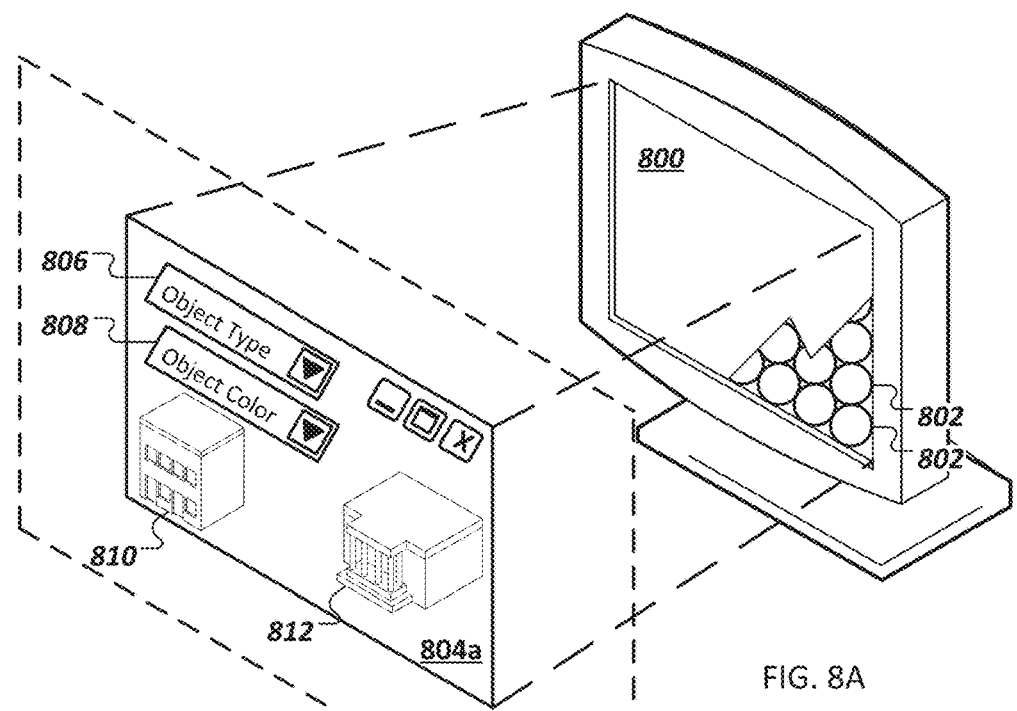
FIGS. 8A-C show an example of an LED display with an array of pixel subsets that present two overlaid images within a narrow viewing angle and present only one of the two images within a wide viewing angle.
Figure 8C:
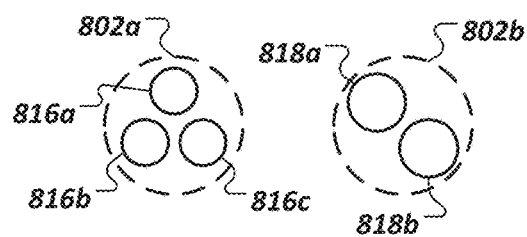
Figure 8B:
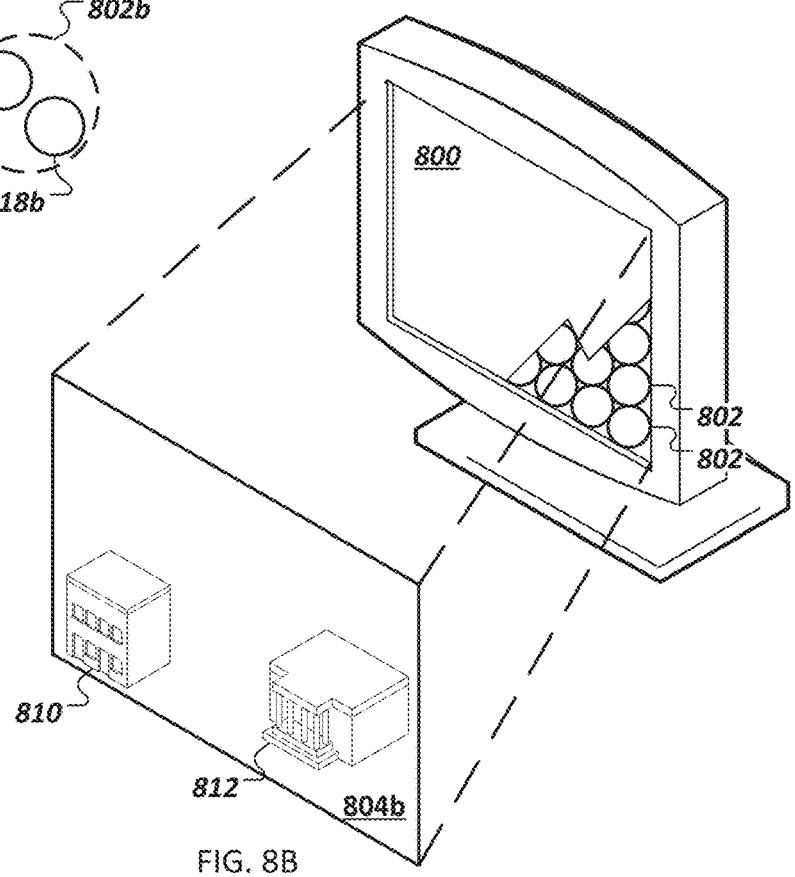

While the directional emitters disclosed above are described in relation to a light field display, they can be advantageously incorporated in other types of displays. For example, they can be used in displays that are capable of overlaying specific information that is viewable only from certain positions with a displayed image that is observable to all viewers. For instance, FIGS. 8A-C show an example of a light emitting diode (LED) display 800 with an array of pixel subsets 802 that present two overlaid images within a narrow viewing angle and present only one of the two images within a wide viewing angle. For instance, the LED display 800 may present a first image that includes wide viewing angle content 810-12 and a second image that includes narrow viewing angle content 806-08. The LED display 800 presents the second image overlaid on top of the first image, as an overlaid image 804*a*, which is viewable within a narrow viewing angle. The LED display 800 presents only the first image 804*b* that is viewable within a wide viewing angle 814 that is greater than the narrow viewing angle.

The second image may include content that viewable by one or only a few viewers. For instance, the second image may include sensitive content, content that may detract from presentation of the first image 804*b*, or both.

In FIGS. 8A-B, the second image includes a menu with an object type selector 806 and an object color selector 808. The first image 804*b* includes an office building 810 and a government building 812. For example, the first image 804*b* may depict an architectural design of a planned development and the second image may depict a menu of options to customize the buildings presented in the first image 804*b*.

The object type selector 806 may allow selection of buildings of different types. The selection may cause a change in type of a building currently presented in the first image 804*b*, or selection of a type for building that can be added to the presentation of the first image 804*b*. The object color selector 808 may allow selection of a color for a selected building presented in the wide viewing angle content 804*b*.

Presentation of the overlaid image 804*a*, that includes the first image and the second image, allows one or only a few viewers to view the narrow viewing angle content 806-08 concurrently while viewing the wide viewing angle content 810-12. For instance, the LED display 800 may present the overlaid image 804*a* to one or more speakers who are giving a presentation. The speakers may use the menu, depicted in the second image from the overlaid image 804*a*, to control the presentation, e.g., by changing the content shown in the first image.

The LED display 800 allows additional viewers, e.g., other than the speakers, to view the first image 804*b* depicting the wide viewing angle content 810-12 within a second viewing angle 814 that is greater than the viewing angle for the narrow viewing angle content 806-08. At least some of the additional viewers, and potentially all of the additional viewers, are unable to see the narrow viewing angle content 806-08 because they are located outside of an area defined by the narrow viewing angle. For example, the additional viewers may view the first image 804*b* from any position within a conference room that includes the LED display 800 while only the speakers, at the front left side of the conference room, can see the overlaid image 804a that includes the narrow viewing angle content 806-08. In some examples, the menu may allow the speakers to navigate through a presentation, e.g., a slide presentation, without showing the menu to the additional viewers watching the presentation.

To cause presentation of the first image separately from the second image, and for both images to have different viewing angles, the LED display 800 includes the array of pixel subsets 802. The array of pixel subsets 802 includes both wide-angle light emitters that present the first image at the wide viewing angle 814 and directional light emitters that present the second image at the narrow viewing angle, e.g., including and around presentation of the overlaid image 804a. In some examples, the narrow viewing angle may be limited to a region defined by the overlaid image 804a.

As shown in FIG. 8C, pixel subsets 802a in the array of pixel subsets 802 may include color specific pixel sub-subsets 816a-c. Each of the color specific pixel sub-subsets 816a-c, included in the pixel subset 802a, includes at least one directional light emitter for the respective color and at least one wide-angle light emitter for the respective color. The color specific pixel sub-subsets 816a-c may be red, green, and blue. In some examples, a pixel subset 802a may include four or more color specific pixel sub-subsets 816, e.g., cyan, magenta, yellow, and black.

When the color specific pixel sub-subset 816a is red, the color specific pixel sub-subset 116a includes a red directional light emitter and a red wide-angle light emitter. Similarly, when the color specific sub-subset 816b is blue, that sub-subset includes a blue directional light emitter and a blue wide-angle light emitter. A green color specific sub-subset 816c includes a green directional light emitter and a green wide-angle light emitter.

In some examples, a light emitter of one angle type is adjacent to a light emitter of another different angle type, e.g., without any intervening light emitters between the two. For instance, the red directional light emitter may be adjacent to the red wide-angle light emitter without any intervening light emitters, e.g., when both light emitters are in the same color specific sub-subset 816a-c.

In some implementations, pixel subsets 802b in the array of pixel subsets may include viewing angle specific sub-subsets 818a-b. For instance, a pixel subset 802b may include a directional pixel sub-subset 818a and a wide-angle pixel sub-subset 818b. The directional pixel sub-subset 818a includes a directional light emitter for each color from a group of multiple colors. For instance, the directional pixel sub-subset 818a may include a red directional light emitter, a blue directional light emitter, and a green directional light emitter. In some examples, the directional pixel sub-subset 818a may include a cyan directional light emitter, a magenta directional light emitter, a yellow directional light emitter, and a black directional light emitter.

The wide-angle pixel sub-subset 818b includes a wide-angle light emitter for each color in the group of multiple colors. For instance, the wide-angle pixel sub-subset 818b may include a red wide-angle light emitter, a blue wide-angle light emitter, and a green wide-angle light emitter. In some examples, the wide-angle pixel sub-subset 818b may include a cyan wide-angle light emitter, a magenta wide-angle light emitter, a yellow wide-angle light emitter, and a black wide-angle light emitter.

When the LED display 800 includes angle specific sub-subsets 818a-b, each of the sub-subsets may include light emitters of a particular angle type that are adjacent to each other. For instance, a directional pixel sub-subset 818a includes three or more directional light emitters, each of which are adjacent to two or more of the other directional light emitters in the directional pixel sub-subset 818a. A wide-angle pixel sub-subset 818b may include three or more wide-angle light emitters, each of which are adjacent to two or more of the other wide-angle light emitters in the wide-angle pixel sub-subset 818b.

At least some of the light emitters of a particular angle type may be adjacent to both light emitters of the same angle type and light emitters of the other angle type. For example, one of the directional light emitters in the directional pixel sub-subset 818a, such as the blue directional light emitter, may be adjacent to the other directional light emitters in the directional pixel sub-subset 818a, such as the green and the red directional light emitters, and at least one wide-angle light emitter in the wide-angle pixel sub-subset 818b, such as the green and red wide-angle light emitters.

In some implementations, the array of pixel subsets 802, shown in FIGS. 8A-B, may include two sub-arrays of pixels. A first sub-array may include the wide-angle pixel subsets. A second sub-array may include the directional pixel sub-sets. For instance, the first sub-array and the second sub-array may be interwoven such that wide-angle light emitters in the first sub-array are near or adjacent to corresponding directional light emitters in the second sub-array.

When the LED display 800 includes two sub-arrays, each of the sub-arrays may have the same number of pixel subsets. For instance, the LED display 800 may have emitters of one angle type that correspond to an emitter of the other angle type. A wide-angle light emitter in a first sub-array may correspond to a directional light emitter in a second sub-array when the two light emitters have the same coordinates in images generated by the corresponding sub-arrays. For instance, a particular wide-angle light emitter, or group of wide-angle light emitters, e.g., with different colors, may generate a particular x-y pixel in a first image. A particular directional light emitter, or group of directional light emitters, e.g., with different colors, that correspond to the particular wide-angle light emitter may generate a particular x-y pixel in a second image, such that both of the particular x-y pixels have the same coordinates in their respective image.

Figure 9:
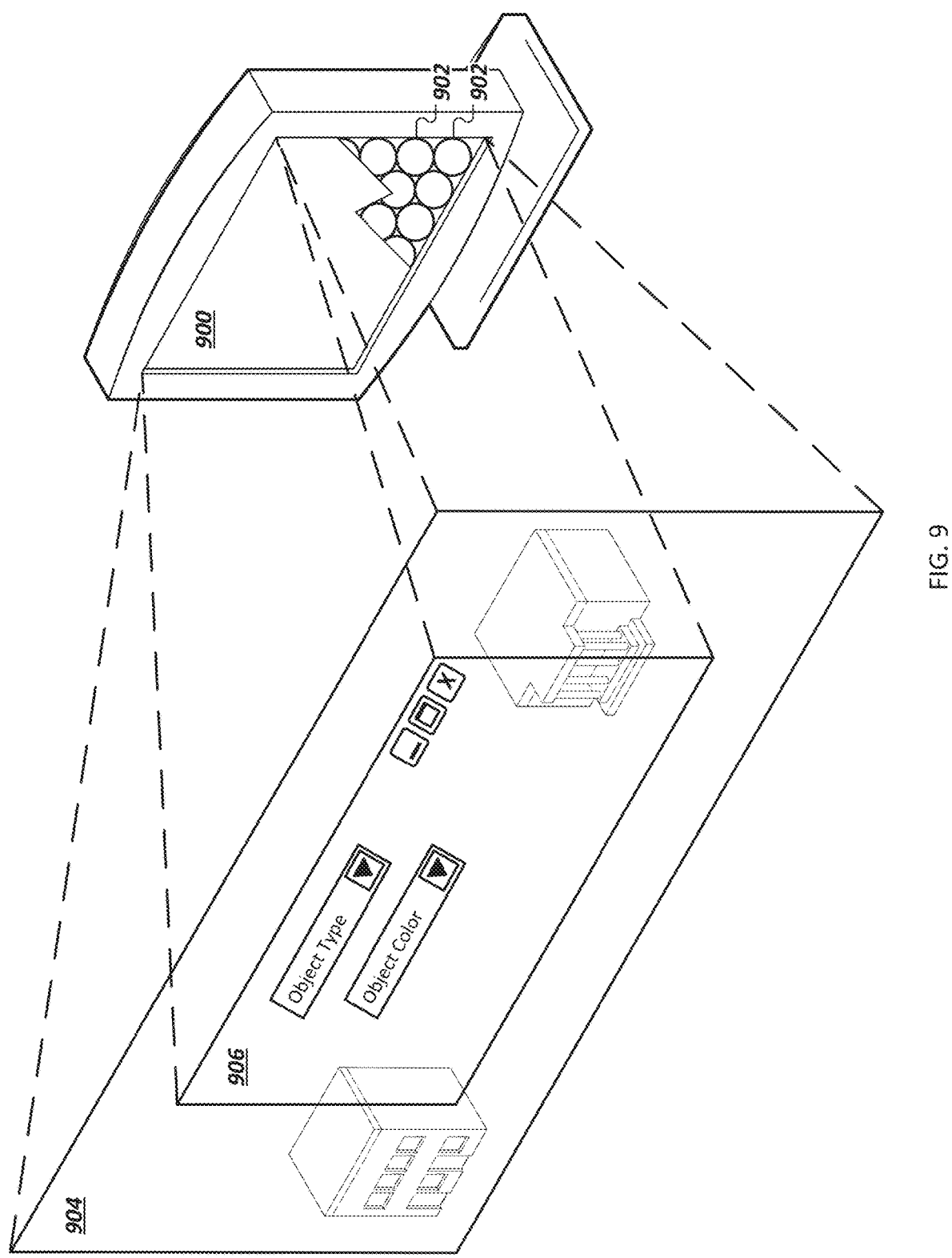
FIG. 9 shows another example of a LED display with an array of pixel subsets that presents two overlaid images of different sizes.

FIG. 9 shows another example of a LED display 900 with an array of pixel subsets 902 that presents two overlaid images of different sizes. The two images may have the same resolution, e.g., and a different quantity of pixels per inch, or different resolutions.

The LED display 900 may generate a first wide-angle image 904 that is viewable within a first wide viewing angle. The LED display 900 may generate a second directional image 906 concurrently with the first wide-angle image 904. The second directional image 906 has a narrow viewing angle that is smaller than, included within, or both, the first wide viewing angle.

The second directional image 906 may include supplemental content, such as a menu, for the first wide-angle image 904. For instance, the second directional image 906 may include menu options to allow a viewer to change content, or the appearance of content depicted, in the first wide-angle image 904.

The LED display 900 may include, as the pixel subsets 902, one or both of the pixel subsets 802a-b described with reference to FIG. 8C. Any of the features described with reference to the LED display 800 or the LED display 900 may be used with the other LED display unless otherwise indicated. For example, the pixel subsets 902 may be color specific, or viewing angle specific, as described in more detail above.

In some examples, the LED display 900 may include an array of pixel subsets 902 that include light emitters of only one angle type, e.g., wide-angle or directional. For example, the LED display 900 may include a first pixel sub-array that includes only wide-angle pixel subsets which are used to generate the first wide-angle image 904 and a second pixel sub-array that includes only directional pixel subsets which are used to generate the second directional image 906.

The LED display 900 may include a sub-array that includes light emitters of both angle types. For example, when the first wide-angle image 904 has a different resolution or a different quantity of pixels per inch, or both, from the second directional image 906, the LED display 900 may include a first sub-array of wide-angle light emitters that generate the portion of the first wide-angle image 904 upon which the second directional image 906 is overlaid and that are near, e.g., within a threshold distance from, corresponding directional light emitters that generate the second directional image 906. A second sub-array may include the wide-angle light emitters that generate the portion of the first wide-angle image 904 upon which the second directional image 906 is not overlaid, that are not within a threshold distance from a corresponding directional light emitter, or both. In this example, the directional light emitters may be located within a center of the LED display 900 and not located adjacent to at least one outside edge of the LED display 900, e.g., not located adjacent to any of the outside edges of the LED display 900.

Figure 10:
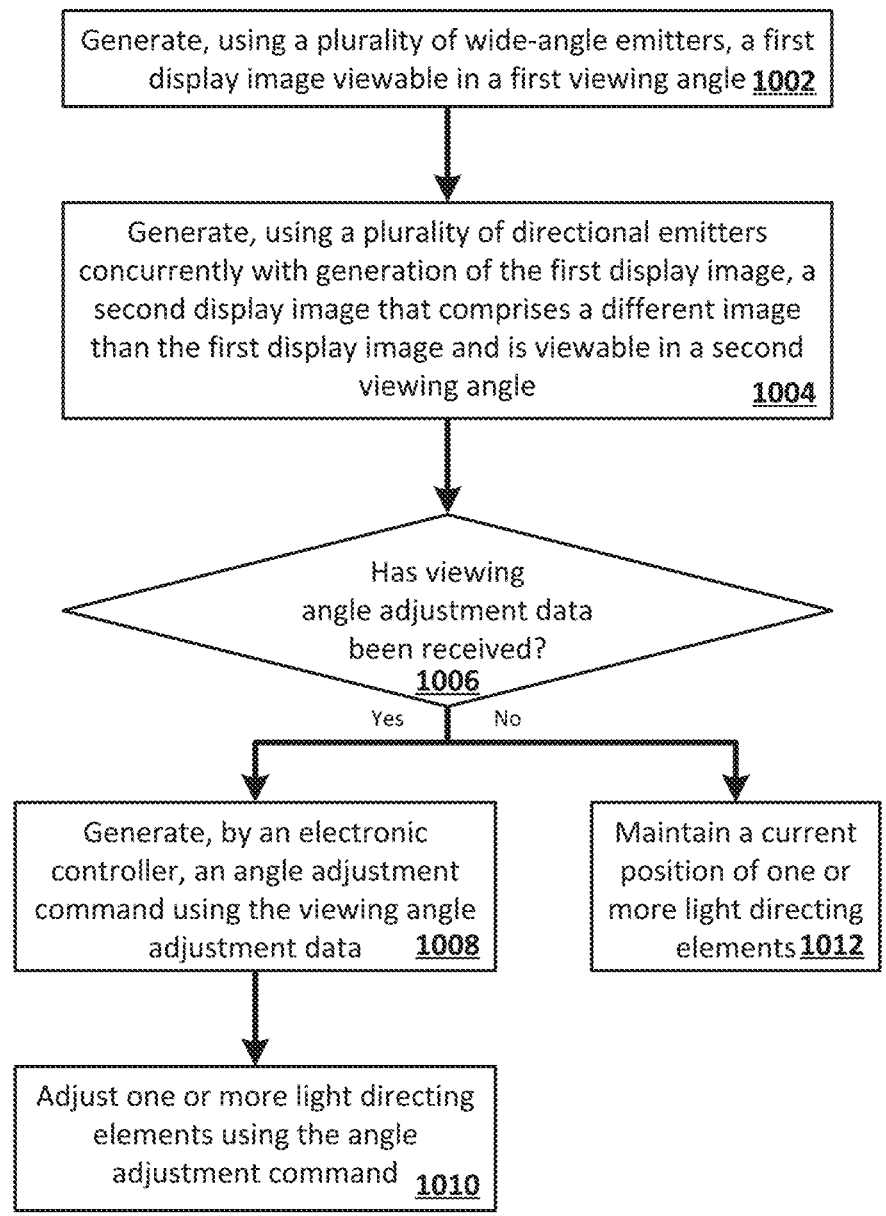
FIG. 10 is a flow diagram of a process for generating two overlaid images using corresponding wide-angle and directional light emitters

FIG. 10 is a flow diagram of a process 1000 for generating two overlaid images using corresponding wide-angle and directional light emitters. For example, the process 1000 can be used by the LED display 800 shown in FIGS. 8A-B or by the LED display 900 shown in FIG. 9.

An LED display generates, using a plurality of wide-angle emitters, a first display image viewable in a first viewing angle (1002). For instance, the LED display may use a first array of wide-angle emitters to generate the first display image of content that is viewable by multiple viewers at multiple different viewing angles within the first viewing angle.

The LED display generates, using a plurality of directional emitters concurrently with generation of the first display image, a second display image that includes a different image than the first display image and is viewable in a second viewing angle (1004). For example, the LED display uses a second array of directional light emitters, that are separate from the wide-angle light emitters, to generate the second display image that is viewable within the second viewing angle that may be narrower than the first viewing angle.

The concurrent presentation of the first display image and the second display image may include an initial presentation of one image after the other image or an initial presentation of both images at substantially the same time. For instance, the LED display may concurrently generate the first display image and the second display image at substantially the same time using the respective emitters. In some examples, the LED display may initially generate the second display image using the directional emitters and then generate the first display image using the wide-angle emitters such that the second display image is presented for a period of time before the first display image is presented concurrently with the second display image. The LED display may initially generate the first display image using the wide-angle emitters and then generate the second display image using the directional emitters such that the first display image is presented for a period of time before the second display image is presented concurrently with the first display image.

In some examples, each of the directional light emitters is adjacent to a wide-angle light emitter. A directional light emitter of a particular color, e.g., each directional light emitter, may be adjacent to a wide-angle light emitter of the particular color. Each of the wide-angle light emitters may be adjacent to a directional light emitter, e.g., of the same color.

In some implementations, each of the light emitters is adjacent to light emitters of different colors than a color of the respective light emitter. For instance, each red directional light emitter may be adjacent to a green directional light emitter and a blue directional light emitter. Each of the wide-angle light emitters may be adjacent to wide-angle light emitters of different colors than a color of the respective wide-angle light emitter.

The LED display determines whether viewing angle adjustment data has been received (1006). The LED display may use any appropriate method to determine whether viewing angle adjustment data, e.g., for the directional light emitters, has been received.

For instance, when the LED display includes a camera, the LED display may use an eye-tracking component to determine eye movement data for a viewer using multiple images of the viewer that were captured by the camera. The eye-tracking component may use the eye movement data to generate viewing angle adjustment data that indicates a change to the viewing angle of one or more of the directional light emitters. The viewing angle adjustment data may identify different adjustments for each of the directional light emitters, adjustments that apply to groups of two or more directional light emitters, or a single adjustment that applies to all of the directional light emitters. The eye-tracking component may provide the viewing angle adjustment data to an electronic controller to cause the electronic controller to adjust the second viewing angle.

In some implementations, the LED display may include a communication module that receives the viewing angle adjustment data. For example, the communication module may communicate with another system or device, such as a laptop computer, that includes a camera and an eye-tracking component that generates the viewing angle adjustment data. The communication module may receive the viewing angle adjustment data over a wired connection, a wireless connection, or both. The communication module may provide the viewing angle adjustment data to an electronic controller to cause the electronic controller to adjust the second viewing angle.

In response to determining that viewing angle adjustment data has been received, the LED display generates, with an electronic controller, an angle adjustment command using the viewing angle adjustment data (1008). For instance, the electronic controller determines, for each of the directional light emitters, an angle adjustment command using the viewing angle adjustment data. The angle adjustment command may include a separate command for each directional light emitter, a separate command for groups of directional light emitters, or a command for all of the directional light emitters. A group of directional light emitters may include a pixel subset, a color specific pixel sub-subset, or a directional pixel sub-subset.

The LED display adjusts one or more light directing elements using the angle adjustment command (1010). For example, the electronic controller may provide the angle adjustment command to one or more light directing elements to cause the light directing elements to adjust the second viewing angle for the second display image, e.g., the directional display image.

The electronic controller may include the one or more light directing elements. The electronic controller may include one light directing element for each directional light emitter. The electronic controller may include one light directing element for each group of directional light emitters, e.g., for each pixel subset, each color specific pixel sub-subset, or each directional pixel sub-subset. In some examples, the electronic controller may include a single light directing element for all of the directional light emitters.

In response to determining that viewing angle adjustment data has not been received, the LED display maintains a current position of one or more light directing elements (1012). For instance, the LED display determines to maintain the second viewing angle for the second display image, generated by the directional light emitters, when the LED display does not receive any viewing angle adjustment data. The LED display may determine to maintain a current position of all of the one or more light directing elements.

The order of steps in the process 1000 described above is illustrative only, and generating the two overlaid images using the corresponding wide-angle and directional light emitters can be performed in different orders. For example, the LED display may generate the second display image and then generate the first display image. In some examples, the LED display may begin to generate the first display image at substantially the same time that the LED display begins to generate the second display image.

In some implementations, the process 1000 can include additional steps, fewer steps, or some of the steps can be divided into multiple steps. For example, the LED display may perform steps 1002, 1004, and 1012 without performing steps 1006-1010.

As noted previously, the disclosed displays are controlled by an electronic controller that delivers signals to each subpixel coordinating their operation to so that the display displays the desired images or light fields. In general, components of the electronic controller can be housed in the same housing as the display panel and/or can be contained in a separate housing.

Figure 11:
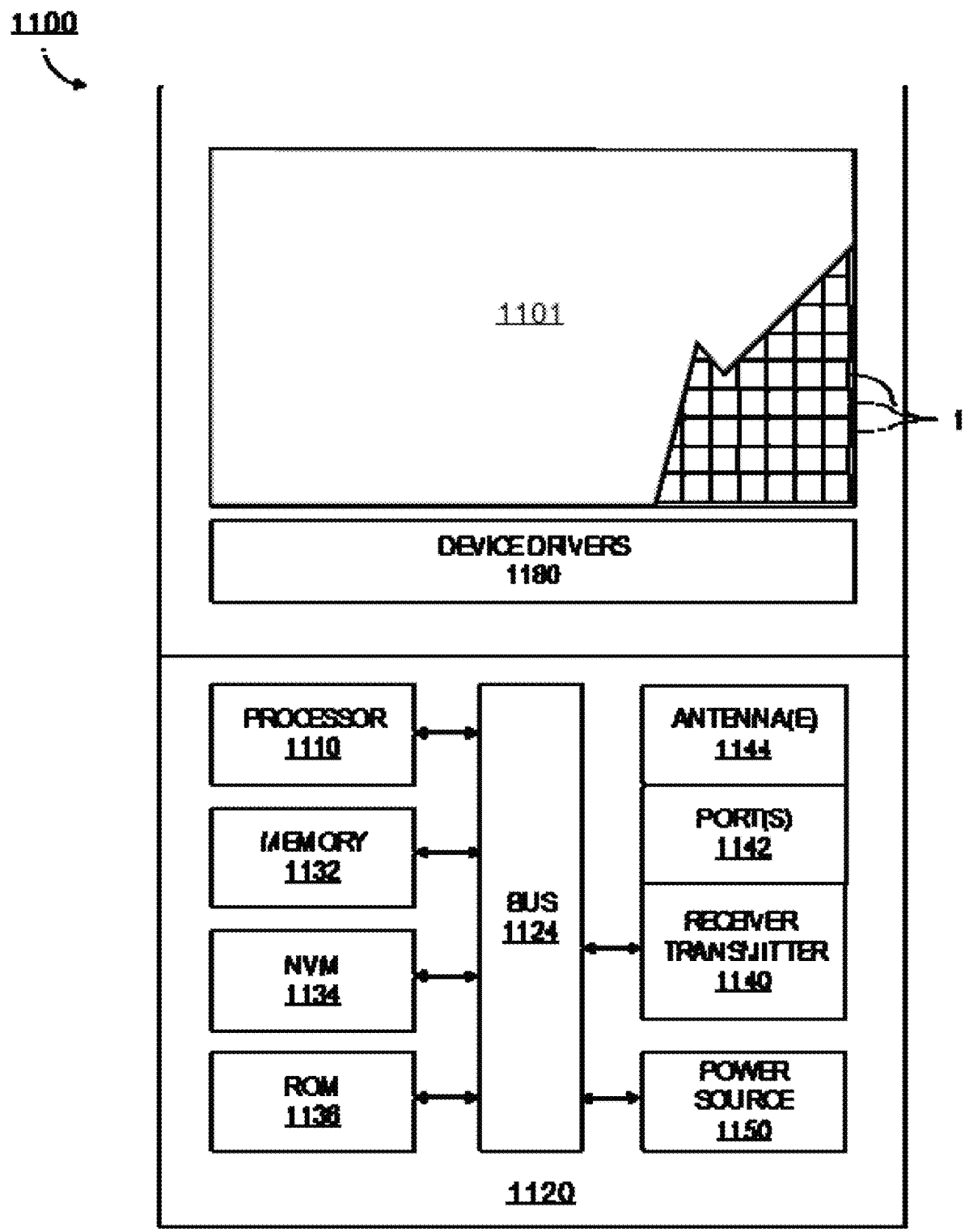
FIG. 11 is a schematic diagram of a display including details of an electronic controller.

Components of an electronic controller for a display 1100 are shown schematically in FIG. 11, which includes a display 1101 composed of pixels 1130, device drivers 1180 for pixels 1130, and device electronics 1120. Electronics 1120 includes a bus 1124, which servers to communicate data between other components of the device electronics and device drivers 1180. Bus 1124 is illustrated as a single bus for simplicity, but may represent multiple different interconnects or buses and the component connections to such interconnects or buses may vary.

Device electronics 1120 includes a processor 1110 coupled to bus 1124, to provide control instructions for the display. Generally, processor 430 can include one or more processors or controllers, including one or more physical processors and one or more logical processors. General-purpose processors and/or special-processor processors can be used.

Electronics 1120 further includes a random access memory (RAM) or other dynamic storage device or element as a main memory 1132 for storing information and instructions to be executed by processor 1110. Electronics 1120 also includes a non-volatile memory 1134 and a read only memory (ROM) 1136 or other static storage device for storing static information and instructions for the processor.

Electronics 1120 also includes one or more transmitters or receivers 1140 coupled to bus 1124, as well as one or more antenna(e) 1144 and one or more port(s) 1142. Antennae 1144 can include dipole or monopole antennae, for the transmission and reception of data via wireless communication using a wireless transmitter, receiver, or both. Ports 1142 are used for the transmission and reception of data via wired communications. Wireless communication includes, but is not limited to, Wi-Fi, Bluetooth™, near field communication, and other wireless communication standards. Wired communication includes, but is not limited to, USB® (Universal Serial Bus) and FireWire® ports.

Device electronics 1120 can also include a battery or other power source 1150, which may include a solar cell, a fuel cell, a charged capacitor, near field inductive coupling, or other system or device for providing or generating power in the supporting electronics 1120. The power provided by power source 1150 may be distributed as required to elements of the electronics 1120.

Figure 12:
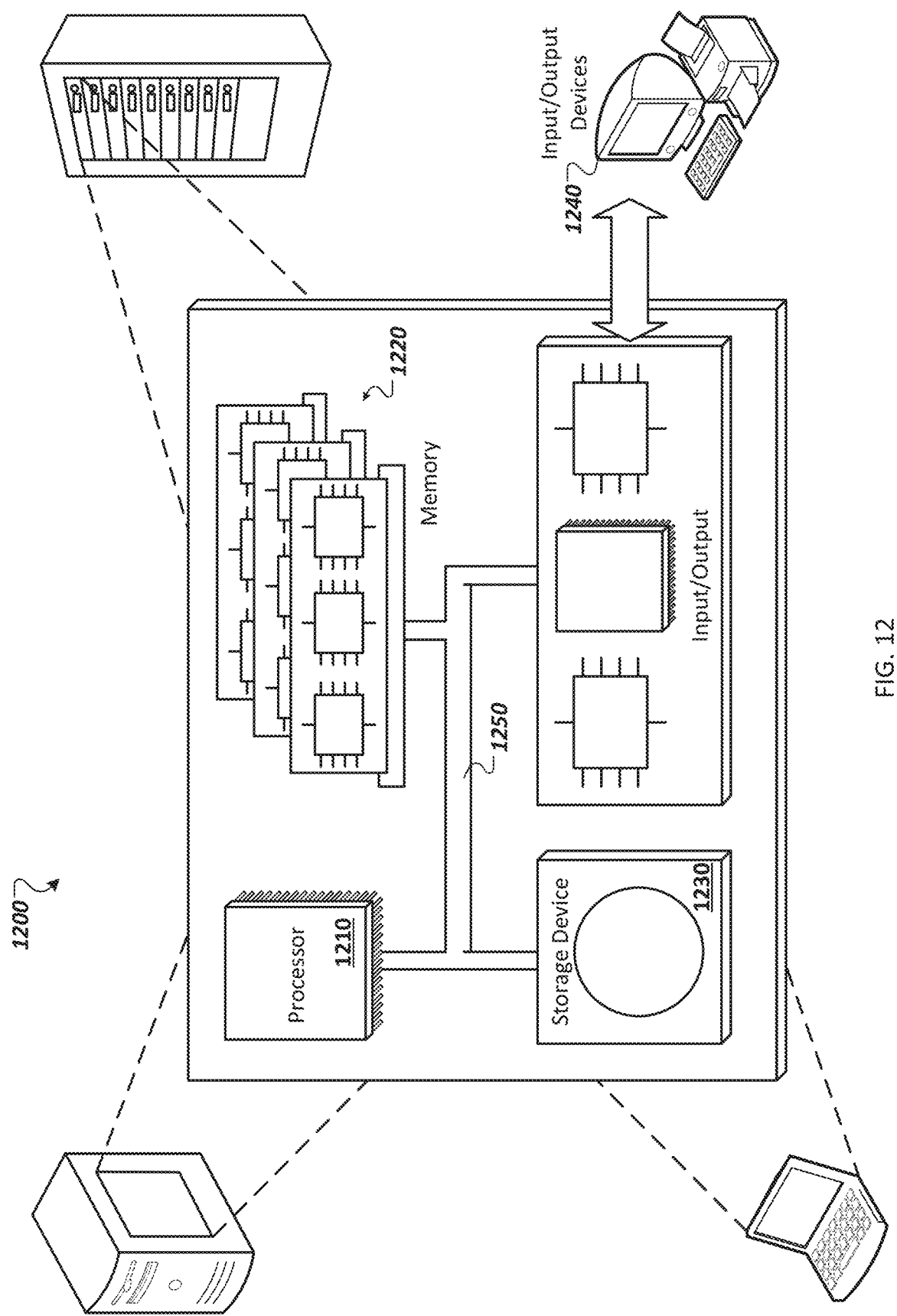
FIG. 12 is a schematic diagram of an example computer system that can be part of or used in conjunction with the devices described above.

In some embodiments, the foregoing displays are interfaced with or form part of a computer system. FIG. 12 is a schematic diagram of an example computer system 1200. The system 1200 can be used to carry out the operations described in association the implementations described previously (e.g., those of controller 120). In some implementations, computing systems and devices and the functional operations described above can be implemented in digital electronic circuitry, in tangibly-embodied computer software or firmware, in computer hardware, including the structures disclosed in this specification (e.g., system 1200) and their structural equivalents, or in combinations of one or more of them. The system 1200 is intended to include various forms of digital computers, such as laptops, desktops, workstations, personal digital assistants, servers, blade servers, mainframes, and other appropriate computers, including vehicles installed on base units or pod units of modular vehicles. The system 1200 can also include mobile devices, such as personal digital assistants, cellular telephones, smartphones, and other similar computing devices. Additionally, the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 1200 includes a processor 1210, a memory 1220, a storage device 1230, and an input/output device 1240. Each of the components 1210, 1220, 1230, and 1240 are interconnected using a system bus 1250. The processor 1210 is capable of processing instructions for execution within the system 1200. The processor may be designed using any of a number of architectures. For example, the processor 1210 may be a CISC (Complex Instruction Set Computers) processor, a RISC (Reduced Instruction Set Computer) processor, or a MISC (Minimal Instruction Set Computer) processor.

In one implementation, the processor 1210 is a single-threaded processor. In another implementation, the processor 1210 is a multi-threaded processor. The processor 1210 is capable of processing instructions stored in the memory 1220 or on the storage device 1230 to display graphical information for a user interface on the input/output device 1240.

The memory 1220 stores information within the system 1200. In one implementation, the memory 1220 is a computer-readable medium. In one implementation, the memory 1220 is a volatile memory unit. In another implementation, the memory 1220 is a non-volatile memory unit.

The storage device 1230 is capable of providing mass storage for the system 1200. In one implementation, the storage device 1230 is a computer-readable medium. In various different implementations, the storage device 1230 may be a floppy disk device, a hard disk device, an optical disk device, or a tape device.

The input/output device 1240 provides input/output operations for the system 1200. In one implementation, the input/output device 1240 includes a keyboard and/or pointing device. In another implementation, the input/output device 1240 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

As used herein, the term "perpendicular" refers to a relationship between two elements (e.g., lines, axes, planes, surfaces, or components) forming approximately a 90° angle within acceptable engineering, fabrication, or measurement tolerances as understood by someone of ordinary skill in the art.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. For example, while the foregoing displays are depicted as direct view displays (e.g., televisions or computer monitors), other implementations are possible. For instance, the disclosed technologies can be implemented in displays for handheld devices, automotive displays, wearable displays (e.g., head mounted displays), and/or avionic displays (e.g., either in cockpit displays or in-flight entertainment systems).

What is claimed is:

1. A light emitting diode display comprising:
    an array of pixels, each pixel comprising at least one directional light emitter and at least one wide-angle light emitter,
        a first combination of all the directional light emitters configured to generate a first display image viewable within a first viewing angle, and
        a second combination of all the wide-angle light emitters configured to generate, concurrently with the generation of the first display image, a second display image that a) is a different image than the first display image, b) is viewable within a second viewing angle that is wider than and encompasses the first viewing angle, and c) creates, within the first viewing angle, an overlaid image from the combination of the first display image and the second display image;
    an electronic controller to generate a signal that causes the light emitting diode display to change a viewing angle for the directional light emitters; and
    an eye-tracking component to determine eye movement data for a viewer, generate viewing angle adjustment data, and provide the viewing angle adjustment data to the electronic controller to change the viewing angle of the directional light emitters.

2. The light emitting diode display of claim 1, wherein the eye-tracking component comprising:
    a camera configured to capture one or more images to record eye movement of the viewer;
    a processor configured to analyze the captured image or video and generate viewing angle adjustment data based on the analysis result; and
    a communication unit communicated to the electronic controller and configured to transmit the viewing angle adjustment data to the electronic controller.

3. The light emitting diode display of claim 1, wherein the viewing angle adjustment data comprises:
    a change of the viewing angle of one or more of the directional light emitters;
    adjustments for each of the directional light emitters;
    adjustments that apply to groups of two or more directional light emitters; and
    a single adjustment that applies to all of the directional light emitters.

4. The light emitting diode display of claim 1, wherein the array of pixels comprises groups of viewing angle specific sub-pixels, each of the viewing angle specific sub-pixels comprises a light emitter specific to the corresponding viewing angle.

5. The light emitting diode display of claim 1,
    wherein the viewing angle is an angle at which the display projects light from the directional light emitters,
    wherein the eye-tracking component determines a predicted angle at which the viewer is looking at the light emitting diode display, and
    wherein the predicted angle is used to determine the viewing angle adjustment data.

6. The light emitting diode display of claim 1, further comprising a communication module to receive viewing angle adjustment data and provide the viewing angle adjustment data to the electronic controller.

7. The light emitting diode display of claim 1, wherein the generating of the viewing angle adjustment data comprises:
    capturing, by a camera, one or more images; and
    determining, by the eye-tracking component, the viewing angle adjustment data using the one or more images.

8. The light emitting diode display of claim 1, wherein the eye-tracking component is configured to:
    adjust narrow viewing angle for a particular viewer by following movement of the particular viewer; and
    reduce a likelihood that other viewers can view the narrow viewing angle content.

9. The light emitting diode display of claim 1, wherein the electronic controller comprises an array of controllable light directing elements.

10. The light emitting diode display of claim 9, wherein the electronic controller comprises one light directing element for each of the directional light emitters.

11. The light emitting diode display of claim 9, wherein the electronic controller comprises one light directing element for each group of the directional light emitters.

12. A method comprising:
    generating, by a light emitting diode display using a plurality of wide-angle emitters, a first display image viewable in a first viewing angle; and
    generating, by the display using a plurality of directional emitters concurrently with generation of the first display image, a second display image that a) is a different image than the first display image, b) is viewable within a second viewing angle that is wider than and encompasses the first viewing angle, and c) creates, within the first viewing angle, an overlaid image from the combination of the first display image and the second display image;
    tracking eye movement of a viewer using an eye-tracking component;
    determining viewing angle adjustment data based on the eye movement of the viewer; and
    generating, by an electronic controller, angle adjustment commands using the viewing angle adjustment data, wherein changing, by the electronic controller, the second viewing angle of the second display image comprises adjusting, by the electronic controller, one or more light directing elements using the angle adjustment commands.

13. The method of claim 12, wherein the tracking eye movement of a viewer comprising:
    capturing, by a camera, one or more images to record eye movement of the viewer;
    analyzing, by a processor, the captured images;
    generating, by the processor, viewing angle adjustment data based on the analysis result; and
    transmitting, by a communication unit, the viewing angle adjustment data to the electronic controller.

14. The method of claim 12, wherein generating, by the display using the plurality of directional emitters concurrently with generation of the first display image, the second display image comprises
    generating, by the display using the plurality of directional emitters after generation of the first display image, the second display image for presentation concurrently with presentation of the first display image.

15. The method of claim 12, further comprising:
    determining, by the eye-tracking component, a predicted angle at which a viewer is looking at the light emitting diode display; and
    determining the viewing angle adjustment data by using the predicted angle.

16. The method of claim 12, further comprising:
receiving, by a communication module, the viewing angle adjustment data; and
providing the viewing angle adjustment data to the electronic controller.

17. The method of claim 12, wherein the determining viewing angle adjustment data comprises:
determining, by the eye-tracking component, the viewing angle adjustment data using the one or more images.

18. The method of claim 12, further comprising:
adjusting narrow viewing angle for a particular viewer by following movement of the particular viewer; and
reducing a likelihood that other viewers can view the narrow viewing angle content.

19. The method of claim 12, further comprising:
changing, by the display using an electronic controller, the second viewing angle of the second display image.

20. The method of claim 19, wherein changing the second viewing angle of the second display image comprising adjusting, by the electronic controller, one or more light directing elements to change the second viewing angle of the second display image.

* * * * *